(12) United States Patent
Cheng et al.

(10) Patent No.: US 9,484,359 B2
(45) Date of Patent: Nov. 1, 2016

(54) MOSFET WITH WORK FUNCTION ADJUSTED METAL BACKGATE

(71) Applicant: GLOBALFOUNDRIES INC., Grand Cayman, KY (US)

(72) Inventors: Kangguo Cheng, Schenectady, NY (US); Bruce B Doris, Slingerlands, NY (US); Pranita Kerber, Mount Kisco, NY (US); Ali Khakifirooz, Los Altos, CA (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/696,736

(22) Filed: Apr. 27, 2015

(65) Prior Publication Data

US 2015/0263041 A1    Sep. 17, 2015

Related U.S. Application Data

(62) Division of application No. 13/398,151, filed on Feb. 16, 2012, now Pat. No. 9,105,577.

(51) Int. Cl.
*H01L 27/12* (2006.01)
*H01L 21/84* (2006.01)
*H01L 21/265* (2006.01)
*H01L 29/66* (2006.01)
(Continued)

(52) U.S. Cl.
CPC ....... *H01L 27/1203* (2013.01); *H01L 21/2652* (2013.01); *H01L 21/26586* (2013.01); *H01L 21/76267* (2013.01); *H01L 21/84* (2013.01); *H01L 29/45* (2013.01); *H01L 29/66772* (2013.01); *H01L 29/7831* (2013.01); *H01L 29/78648* (2013.01)

(58) Field of Classification Search
CPC ........... H01L 27/1203; H01L 21/2652; H01L 21/823431
See application file for complete search history.

(56) References Cited

U.S. PATENT DOCUMENTS 5,387,555 A    2/1995 Linn et al.
7,045,406 B2   5/2006 Huotari et al.
(Continued)

OTHER PUBLICATIONS

P. Ranade et al,. "Work Function Engineering of Molybdenum Gate Electrodes by Nitrogen Implantation," Electrochemical and Solid-State Letters, 4 (11), G85-G87 (2001).
(Continued)

*Primary Examiner* — Zandra Smith
*Assistant Examiner* — John M Parker
(74) *Attorney, Agent, or Firm* — Scully, Scott, Murphy & Presser, P.C.

(57) ABSTRACT

An SOI substrate, a semiconductor device, and a method of backgate work function tuning. The substrate and the device have a plurality of metal backgate regions wherein at least two regions have different work functions. The method includes forming a mask on a substrate and implanting a metal backgate interposed between a buried oxide and bulk regions of the substrate thereby producing at least two metal backgate regions having different doses of impurity and different work functions. The work function regions can be aligned such that each transistor has different threshold voltage. When a top gate electrode serves as the mask, a metal backgate with a first work function under the channel region and a second work function under the source/drain regions is formed. The implant can be tilted to shift the work function regions relative to the mask.

10 Claims, 18 Drawing Sheets

(51) Int. Cl.
*H01L 29/786* (2006.01)
*H01L 21/762* (2006.01)
*H01L 29/45* (2006.01)
*H01L 29/78* (2006.01)

(56) References Cited

U.S. PATENT DOCUMENTS

| | | |
|---|---|---|
| 7,145,212 B2 | 12/2006 | Chan et al. |
| 7,397,090 B2 | 7/2008 | Mathew et al. |
| 2001/0014508 A1 | 8/2001 | Lin et al. |
| 2002/0043693 A1 | 4/2002 | Tiwari et al. |
| 2002/0106858 A1 | 8/2002 | Zheng et al. |
| 2002/0142562 A1 | 10/2002 | Chan et al. |
| 2006/0234428 A1 | 10/2006 | Furukawa et al. |
| 2007/0132011 A1 | 6/2007 | Kato |
| 2007/0138533 A1 | 6/2007 | Dennard et al. |
| 2008/0191286 A1 | 8/2008 | Chang et al. |
| 2009/0134466 A1 | 5/2009 | Cho et al. |
| 2009/0283835 A1 | 11/2009 | Yu et al. |
| 2009/0286387 A1 | 11/2009 | Gilmer et al. |
| 2010/0006823 A1 | 1/2010 | Anderson et al. |
| 2010/0032757 A1 | 2/2010 | Pendharkar |
| 2011/0108943 A1* | 5/2011 | Dennard ........... H01L 21/76254 257/506 |
| 2011/0291171 A1 | 12/2011 | Pekarik et al. |
| 2012/0299105 A1* | 11/2012 | Cai ..................... H01L 27/1203 257/348 |
| 2012/0326231 A1* | 12/2012 | Zhu ..................... H01L 21/2652 257/347 |
| 2013/0146953 A1* | 6/2013 | Cheng .................... H01L 21/84 257/296 |
| 2013/0146959 A1* | 6/2013 | Cheng ............... H01L 29/66181 257/310 |

OTHER PUBLICATIONS

P. Ranade et al., "Molybdenum Gate Electrode Technology for Deep Sub-Micron CMOS Generations," Mat. Res. Soc. Symp. Proc. vol. 670, K5.2.1-K5.2.6 (2001).

H. Wakabayashi et al. "A Dual-Metal Gate CMOS Technology Using Nitrogen-Concentration-Controlled TiNx Film," IEEE Transactions on Electron Devices, vol. 48, No. 10, Oct. 2001, pp. 2363-2369.

Office Action dated Jul. 8, 2015, received in a related U.S. Appl. No. 14/696,693.

Office Action dated Dec. 5, 2014 received in the parent U.S. Patent Application, namely U.S Appl. No. 13/398,151.

* cited by examiner

MOSFET WITH WORK FUNCTION ADJUSTED METAL BACKGATE

CROSS-REFERENCE TO RELATED APPLICATION

This application is a divisional of U.S. patent application Ser. No. 13/398,151, filed Feb. 16, 2012, the entire contents of which are incorporated herein by reference.

BACKGROUND OF THE INVENTION

1. Field of the Invention

The present invention generally relates to a Metal Oxide Semiconductor Field Effect Transistors (MOSFETs) made on semiconductor on insulator (SOI) substrates. In particular, the invention relates to MOSFETs with a work function adjusted metal backgate.

2. Description of Related Art

Work function is a material property defined as the energy needed to move an electron from the Fermi level to vacuum. The work function of a material is of interest in MOSFET applications because tuning the work function of a top gate electrode defines the threshold voltage of the MOSFET and influences the transistor performance.

A top gate electrode comprises a gate dielectric and a gate conductor, usually a metal. To change the top gate work function at least the following approaches have been used: using different metals or metal alloys, adjusting metal thicknesses, manipulating metal composition, or manipulating the gate dielectric so that it contains certain amount of fixed or dipole charges.

In a planar fully-depleted semiconductor-on-insulator (FDSOI) device, such as extremely-thin semiconductor-on-insulator (ETSOI) MOSFETs, it is also possible to adjust the threshold voltage of a transistor by inserting a backgate underneath the device and which is separated from the channel by a thin buried oxide (BOX).

Usually the backgate is formed by implanting dopant species into the semiconductor substrate to form a doped region underneath the BOX. Depending on the polarity of the doped region and the thickness of the buried oxide, the threshold voltage of the transistor can be adjusted.

However, absent a voltage, the Fermi Level of a heavily doped semiconductor region can be only one of the two values that correspond to the conduction band and valence band of the substrate. Therefore without a voltage applied to a doped semiconductor backgate, the doped semiconductor backgate cannot adjust the threshold voltage by an arbitrary value smaller than what is determined by the difference between the conduction band and valence band of the substrate.

To apply a voltage to a semiconductor backgate, contacts must be made to the substrate and isolation regions must be formed between the backgates of different MOSFETs. Furthermore, in order to shift threshold voltages by an arbitrary value, voltages other than ground and the supply voltage are needed. That means circuits are needed to both generate such voltages and to route the voltage to the appropriate contacts throughout the chip. The need for additional contacts, isolation areas, and circuits increases the complexity of the fabrication process and increased chip area.

BRIEF SUMMARY OF THE INVENTION

The current invention provides a metal backgate which makes it possible to adjust the value of a work function between values attainable by implanting the semiconductor substrate with dopant species. By employing a metal backgate, the present invention provides an SOI substrate, a semiconductor device, and a method of backgate work function tuning. The SOI substrate and the semiconductor device are structures having a plurality of metal backgate regions wherein at least two regions have different work functions.

An object of the invention is to provide structures and methods of making planar FDSOI MOSFETs with metal backgates so that the metal backgates having different work function in different regions of the integrated circuit. The different metal backgate work function regions are created by implanting the substrate through a mask.

According to an aspect of the invention, a SOI substrate includes a metal backgate between a BOX layer and a bulk layer. The metal backgate has two regions, a first region and a second doped region.

According to another aspect of the invention, a planar FDSOI MOSFETs with metal backgates are disclosed so that the backgate has different work functions. In one embodiment the different work functions are under different transistors. In another embodiment, a first work function area is underneath the channel and a second work function is underneath the source and drain diffusion regions.

According to a further aspect of the invention, planar FDSOI MOSFETs with metal backgates are disclosed so that the backgate has different work function regions underneath a single device and that these regions are slightly shifted with respect to the channel and source and drain regions of the device.

An advantage of the present invention is that a backgate formed underneath the buried oxide is useful to control the device threshold voltage (herein "Vt"). By controlling the device threshold voltage multiple Vt devices can be achieved, device Vt can be controlled, or device power management can be controlled.

Another advantage of the present invention over other techniques is improved backgate series resistance afforded by use of a metal backgate rather than a doped silicon layer.

A further advantage of the present invention is that a work function tuning ion implantation can adjust the backgate work function for different portions of the wafer, for example under different field effect transistors.

Yet another advantage of the present invention is that the work function tuning implant can be done during device processing (as opposed to substrate fabrication) so that the backgate work function underneath the channel region of a FET is different from the work function underneath the source/drain regions of the same FET. Such tuning can reduce Gate Induced Drain Leakage (herein "GIDL")

An additional advantage is that the work function tuning implant can be tilted so that the backgate work function is different on the two sides of the a device. Such tuning can reduce GIDL and Drain Induced Barrier Leakage (herein "DIBL").

Other characteristics and advantages of the invention will become obvious in combination with the description of accompanying drawings, wherein the same number represents the same or similar parts in all figures.

DETAILED DESCRIPTION OF THE INVENTION

Figure 1:
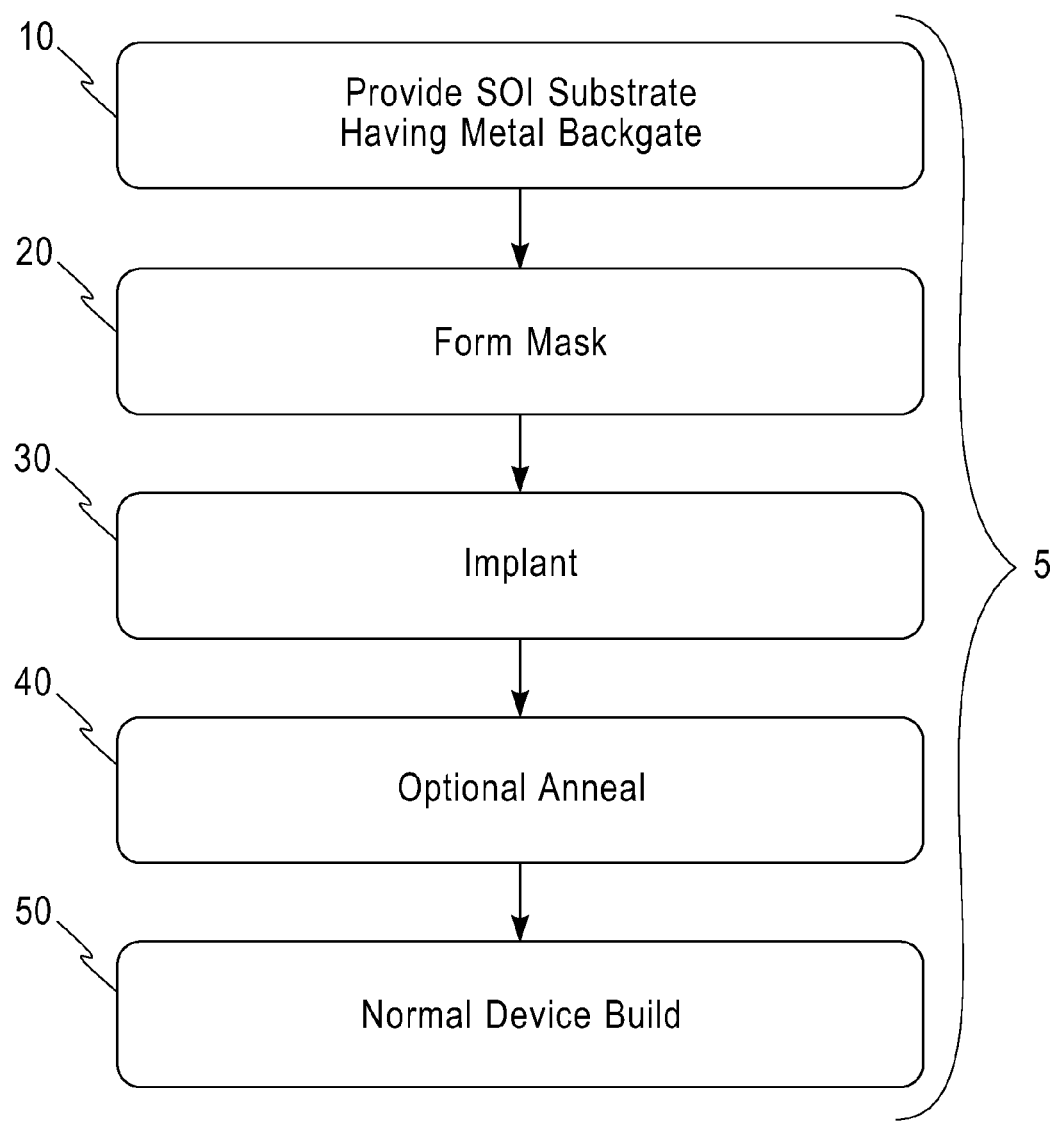
FIG. 1 is a flow chart of steps to create a substrate having a metal backgate with two work function regions according to an embodiment of the present invention.

The basic principle of the invention is a method of tuning work functions of MOSFET metal backgates by ion implantation. The method results in a structure which has at least two metal backgate work function regions. Work function tuning is a way to adjust threshold voltages of a device, thus creating two work function regions which, in turn creates two threshold voltage regions.

The methods to be described can be divided into two large categories: backgate work function tuning prior to device fabrication and backgate work function tuning during device fabrication.

With respect to backgate work function tuning prior to device fabrication, an embodiment of a method and resulting structure will be described in conjunction with FIGS. 1-8. Here, tuning is done by implanting a masked substrate to create two regions in the metal backgate. By tuning prior to device fabrication, a transistor may be made above each backgate region resulting in different devices having different backgate work functions and thus different threshold voltages.

With respect to backgate work function tuning during device fabrication, an embodiment of a method and resulting structure will be described in conjunction with FIGS. 9-15. Another embodiment of a method and the resulting structure will be described in conjunction with FIGS. 9, 10, 13, and 14. A further embodiment of a method and resulting structure will be described in conjunction with FIGS. 16-22. Yet another embodiment of a method and resulting structure will be described in conjunction with FIGS. 23-31.

In the embodiment described in conjunction with FIGS. 9-12, the work function tuning is performed during device fabrication, specifically, after patterning the gate stack. Here, the gate stack serves as a mask during the tuning implantation. By tuning the metal backgate work function with the patterned gate in place, the source and drain regions within the same transistor alter their work functions. Therefore, the source and drain regions within the same transistor have a different work function than the channel region, thus reducing gate-induced drain leakage (GIDL). The gate stack may be a dummy gate stack, a top gate stack with hard mask, or a top gate stack without a hard mask.

In another embodiment described in conjunction with FIGS. 9, 10, 13, and 14, the work function tuning is preformed after patterning the gate stack by tilting the angle of ion implantation. By tuning the metal backgate with an angled ion implant, the work function on the right and left sides of a device are different, thus reducing drain-induced barrier lowering (DIBL) and GIDL.

The further embodiments described in conjunction with FIGS. 16-31 are specific to a gate-last integration scheme. In these embodiments, a work function tuning is preformed through an opening left after removing a dummy gate. By tuning the metal backgate through the opening, the backgate work function in the channel region is altered (note, this is the opposite of the embodiment in FIGS. 9-12). The gate-last embodiment described in conjunction with FIGS. 23-31 provides for two work function implantation steps so that the both regions of the metal backgate are doped.

A detailed description of the invention is made in combination with the following embodiments.

Methods of Tuning Metal Backgate Work-Function Prior to Device Fabrication

FIG. 1 is a flow chart 5 with the steps of tuning a metal backgate to form at least two work function regions on a substrate according to one embodiment. Step 10 is providing a substrate with a metal backgate; step 20 is forming a mask on the substrate; step 30 is ion implanting the substrate; the step 40 is optionally annealing the implanted substrate; step 50 is building the device. Each of the steps, and the resulting structures, will be discussed in detail below. Those skilled in the art will recognize that the step number (10, 20, 30, etc.) does not necessarily indicate an order to perform the step; rather the step numbers are a means of step identification.

Figure 2:
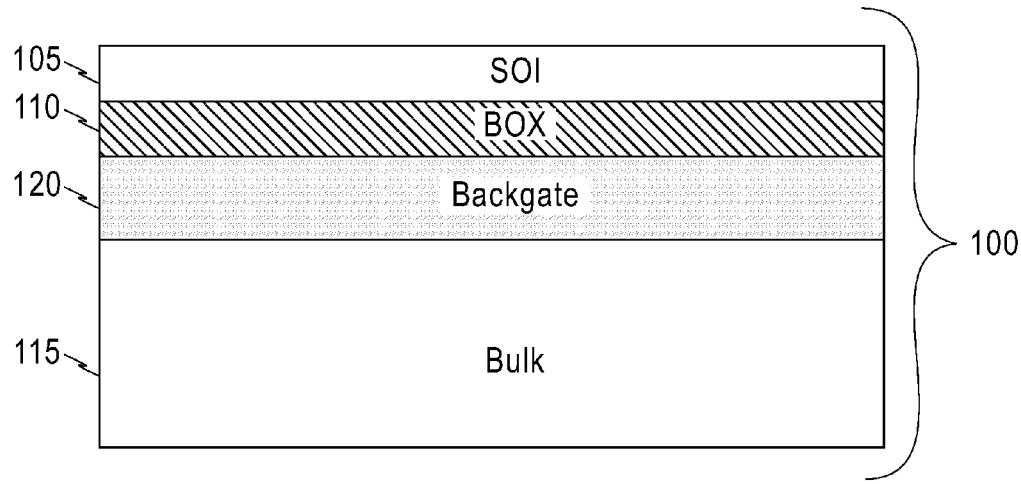
FIG. 2 illustrates an SOI substrate having a metal backgate at a starting point of a method according to an embodiment of the present invention.

Step 10 of tuning a metal backgate to form at least two work function regions is providing a substrate 100 as shown in FIG. 2. The substrate 100 can be a semiconductor on insulator substrate (SOI), and preferably an extremely thin semiconductor on insulator substrate (ETSOI).

Referring to FIG. 2, all SOI substrates, are made of three parts: a bottom bulk semiconductor 115 section (referred to as "bulk" or "bulk layer"), a buried insulator 110 section (referred to as "BOX"), and a semiconductor layer 105 (referred to as "SOI" or "SOI layer") on top of the BOX 110. In the present invention, the substrate 100 has a metal backgate 120 between the BOX 110 and the bulk 115. A suitable substrate may be made according to the methods described in U.S. Pat. No. 7,145,212 issued on Dec. 5, 2006 to K. Chen et al., which is herein incorporated by reference in its entirety.

Referring still to FIG. 2, the SOI 105 layer, can be silicon, silicon doped with conventional 'n' or 'p' dopants, silicon germanium (SiGe), silicon germanium carbon (SiGeC), silicon carbon (SiC), III-V semiconductor compounds (for example $In_{1-x}Ga_xAs$, InP, GaAs) or other variations. The thickness of the SOI layer 105 can vary. A thickness of an SOI layer 105 of may be from about 2 nm to about 50 nm and ranges there between, but is preferably from about 4 nm to about 10 nm and ranges therebetween. A thickness of an SOI layer 105 of an ETSOI substrate may be from about 2 nm to about 20 nm and ranges therebetween, but is preferably from about 2 nm to about 10 nm and ranges therebetween.

Referring again to FIG. 2, the insulating layer of the BOX 110 is a dielectric, preferably silicon dioxide, silicon nitride, silicon oxynitride or a multi-layer stack of these materials. The thickness of the BOX 110 can be from about 5 nm to about 50 nm and ranges therebetween, and is preferably around 25 nm.

Continuing with FIG. 2, the metal backgate 120 can contain any metal but preferably contains a refractory metal and, even more preferably, contains molybdenum, tungsten, titanium, tantalum, a metal nitride such as WN, TiN, TaN, TiAlN, or TaAlN, a metal carbide such as TaC, TiC, ZrC, HfC, or a combination of the above materials. The metal backgate 120 can be deposited by chemical or physical vapor deposition (CVD or PVD, respectively). The metal backgate 120 can have a thickness from about 20 nm to about 500 nm, and ranges therebetween, and preferably is about 50 nm. The metal backgate 120 will have an original work function prior to tuning referred to as the first work function (herein "WF1").

Finally, the bulk 115 layer of substrate 100 is a semiconductor material. The bulk layer 115 can be silicon, silicon doped with conventional 'n' or 'p' dopants, silicon germanium (SiGe), silicon germanium carbon (SiGeC), silicon carbon (SiC), III-V semiconductor compounds (for example $In_{1-x}Ga_xAs$, InP, GaAs) or other variations. In preferred embodiment, the bulk 115 layer is a silicon-containing semiconductor.

Figure 3:
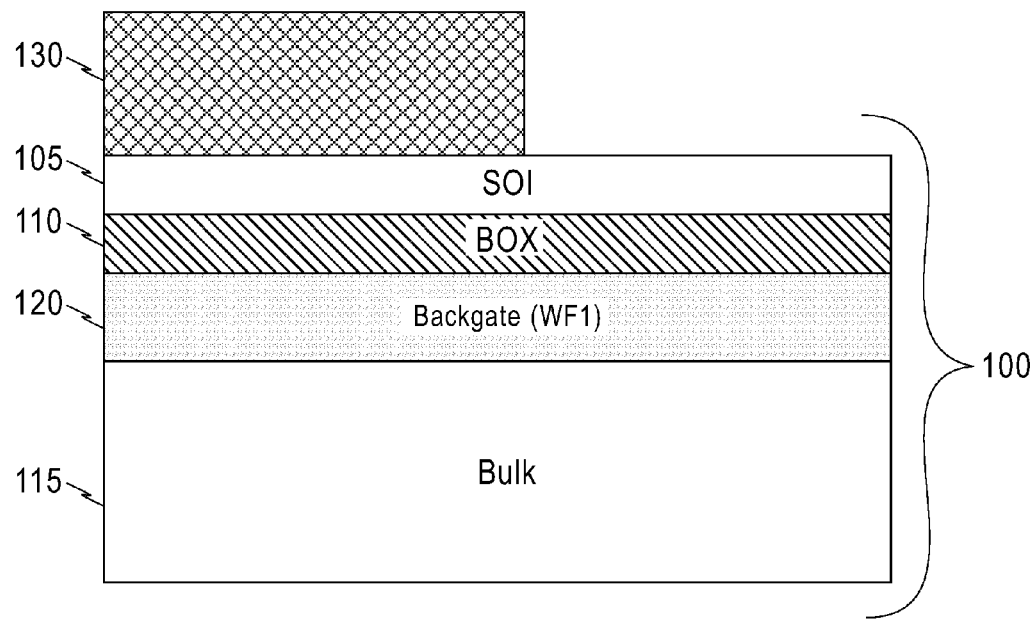
FIG. 3 illustrates masking the substrate according to an embodiment of the present invention.

Referring to FIG. 3, a mask 130 is formed over the substrate. The mask may be soft mask (i.e. made of photoresist) or a hard mask (i.e. made of a variety of materials including, but not limited to insulators). Exemplary hard mask materials include silicon oxides, silicon nitrides, silicon oxynitrides, silicon carbides, silicon oxycarbides, and combinations thereof arranged in layers. If the mask 130 is a soft mask, its thickness is from about 50 nm to about 1000 nm and ranges therebetween, and preferably about 200 nm. If the mask 130 is a hard mask, its thickness is from about 50 nm to about 200 nm and ranges therebetween, and preferably about 100 nm.

Figure 4:
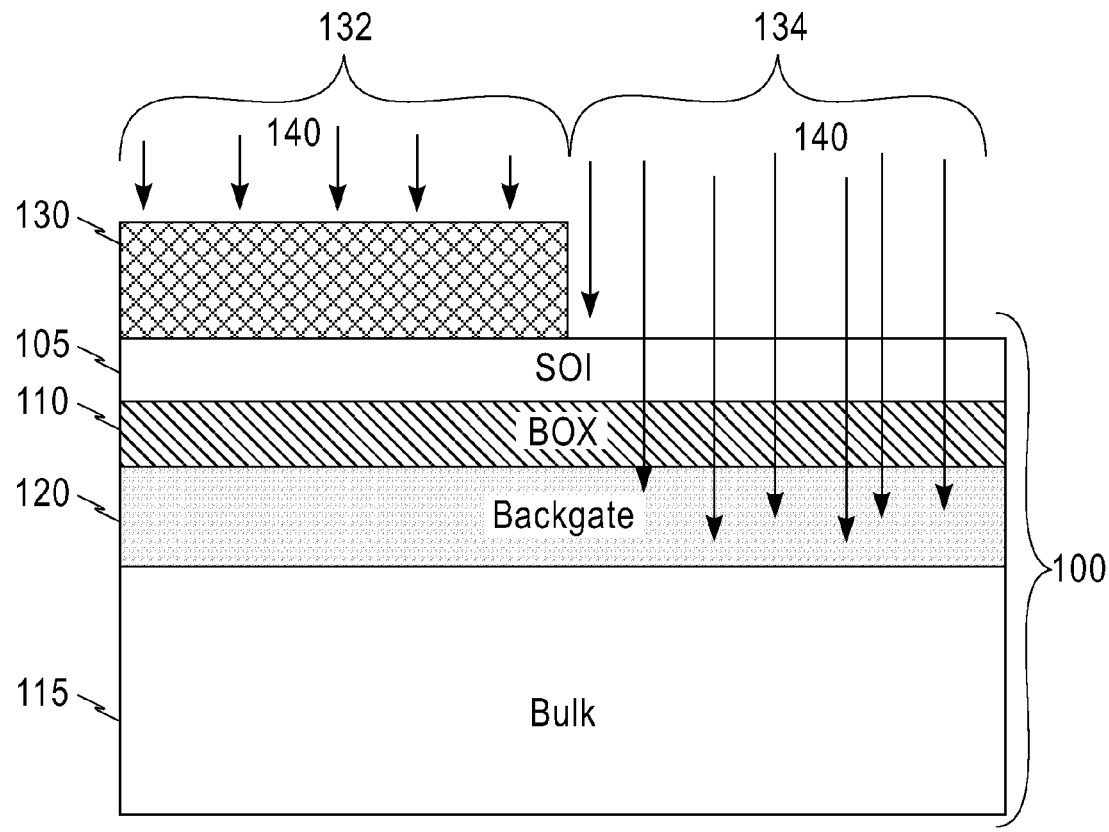
FIG. 4 illustrates ion implanting the masked substrate according to an embodiment of the present invention.

Referring to FIG. 4, ions are implanted 140 into the surface of the substrate 100. The mask 130 substantially blocks the ions from entering the substrate 100 in masked region 132. However, in unmasked region 134, the ions enter the substrate and lodge in the metal backgate 120. Thus, the unmasked 134 region of the metal backgate 120 is "doped" with the implanted species. The implanted species can be a halogen (for example, F, Cl and other elements from Group 17 of the periodic table), an inert species (for example Ar and other elements from Group 18 of the periodic table), Group 14 elements (for example, C or Si), or Group 15 elements (for example, N). In a preferred embodiment, the implant species is nitrogen. An implanted species may also be referred to as a dopant and more particularly as a workfunction dopant. The energy of implant is from about 20 keV to about 100 keV and ranges therebetween; preferably the energy is from about 30 keV to about 60 keV and ranges therebetween. The peak concentration of doped species is from about $10^{19}$ atoms/cm$^3$ to about $10^{21}$ atoms/cm$^3$ and ranges therebetween, and is preferably about $10^{20}$ atoms/cm$^3$. At these energies and concentrations, the damage to a silicon SOI layer 105 is less than $10^{19}$ defects/cm$^3$, well below the amphorization threshold of $5 \times 10^{21}$ defects/cm$^3$. Accordingly, any combination of implant conditions which does not cause the SOI layer 105 to become amorphous can be used.

After implantation, the substrate can be annealed. A typical anneal is from about 600° C. to about 1100° C. and ranges therebetween, and is preferably about 900° C. The anneal time is from about 10 seconds to about 30 min and ranges therebetween. The anneal can take place in an inert ambient, such as argon, nitrogen, helium, or any other inert atmosphere.

It is not necessary that an anneal take place immediately after the implantation. Instead, the anneal can occur at some other point in the process of making a device on the substrate. By way of example, but not limitation, the anneal can occur after shallow trench isolation (STI) formation, after formation of gate stack, after source/drain implant, or after silicide formation. Likewise, the anneal, instead of being a separate and distinct step, can be concurrent with normal device processing, meaning, for example, a post-source/drain implant anneal can serve as both a work function tuning anneal and the source/drain anneal. Similarly, the silicide formation heat treatment can serve as both a work function tuning anneal and the silicide formation anneal. Thus, in the present invention, "optional anneal" means that there is a distinct and separate anneal step just for work function tuning, and the "optional anneal" is not concurrent with another heat treatment of a normal device build (for example, source/drain or silicide formation).

Whether the anneal is a distinct, separate work function anneal (optional anneal) or a heat treatment which occurs during the course of other normal processing, it has the same effect on the metal backgate. Namely, the heat treatment results in a more homogeneous distribution of implanted species within the metal backgate and repairs ion implantation damage.

Figure 5:
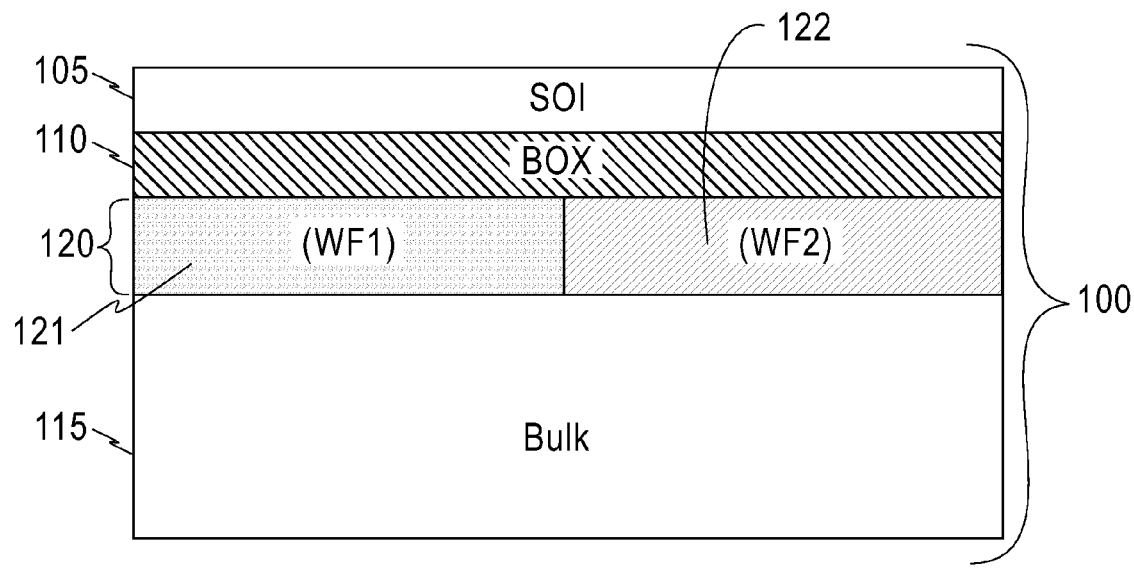
FIG. 5 illustrates a substrate having a metal backgate with two regions according to an embodiment of the present invention.

Referring to FIG. 5, a substrate 100 after removing the mask 130 and optionally annealing is shown. The substrate 100 now has two regions in the metal backgate 120: a first region 121 shielded form the implantation by the mask 130 and a second region 122 which received the implanted species (i.e. a doped region). The implantation (and optional anneal) alters the work function of the implanted second region 122. As a result, the first region 121 of the metal backgate 120 retains the original or first work function (WF1) while the second region has a different second work function (WF2).

The magnitude and direction of the work function change depends at least upon the metal used as the backgate 120, the implant conditions, and the annealing conditions. The thicknesses of materials through which the implant species travel, also play a role. For example, increasing implantation dose decreases the work function for a molybdenum backgate. A 700 C anneal also decreases the work function, but an anneal at 900 C increases the work function. Likewise, in a titanium nitride metal backgate, increased nitrogen content from ion implantation reduces the work function, meaning WF2<WF1. However, for tungsten, usually WF2>WF1, meaning an increase in ion implanted nitrogen increases work function; but the trend can be altered depending on exact process conditions.

Generally speaking, the work function can change from about 50 meV to about 500 meV. For example, molybdenum typically has a first work function (WF1) of about 5.0 eV. After ion implantation with nitrogen at a dose of $4 \times 10^{15}$ cm$^{-2}$ and annealing at 900° C., the nitrogen-doped molybdenum has a second work function (WF2) of about 4.8 eV, a difference of 200 meV. In a device having a 20 nm-thick BOX, this work function change results in about a 20 mV decrease in the nFET threshold voltage and about a 20 mV increase in pFET threshold voltage.

Figure 6:
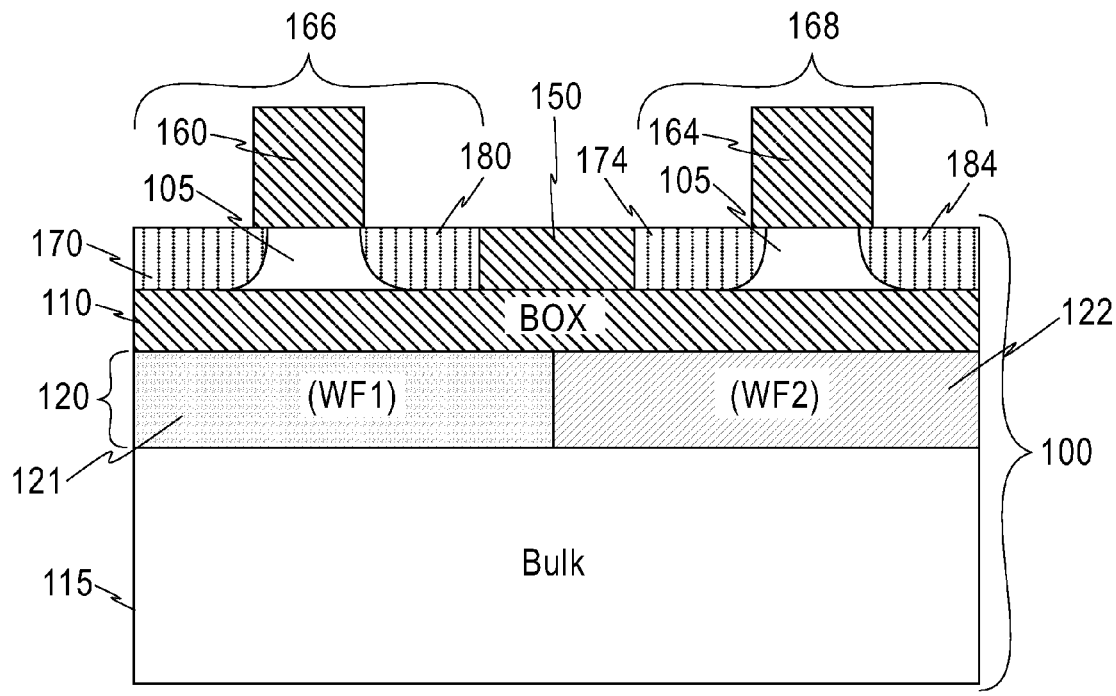
FIG. 6 illustrates a substrate having two transistors, each aligned over a different region of the metal backgate wherein each region has a different work function.

Referring to FIG. 6, the substrate having a metal backgate with two regions is shown after subsequent normal device build steps. Normal device build steps include forming a shallow trench isolation region 150, forming first and second source regions (170 and 174, respectively) and drain regions (180 and 184, respectively) and forming first and second patterned gate stacks (160 and 164, respectively).

The result of the build steps is a first field effect transistor region 166 over a metal backgate 120 first region 121 that has a first work function (WF1) and a second field effect transistor region 168 over a metal backgate 120 second region 122 having a second work function (WF2). Thus, devices with different backgate work functions are created on the same substrate. Because the devices have different backgate work functions, the devices can have different threshold voltages. For example, in a pair of pMOSFET devices, the device with the greater work function will have lower threshold voltage. In a pair of nMOSFET devices, the device with the greater work function will have higher threshold voltage.

The method described in conjunction with FIGS. 3-5 may be repeated so as to have cycles of mask formation, implantation, and mask removal. After the last cycle, the substrate can be annealed. By masking and implanting into different regions, a substrate with more than two work function regions can be created.

Figure 7:
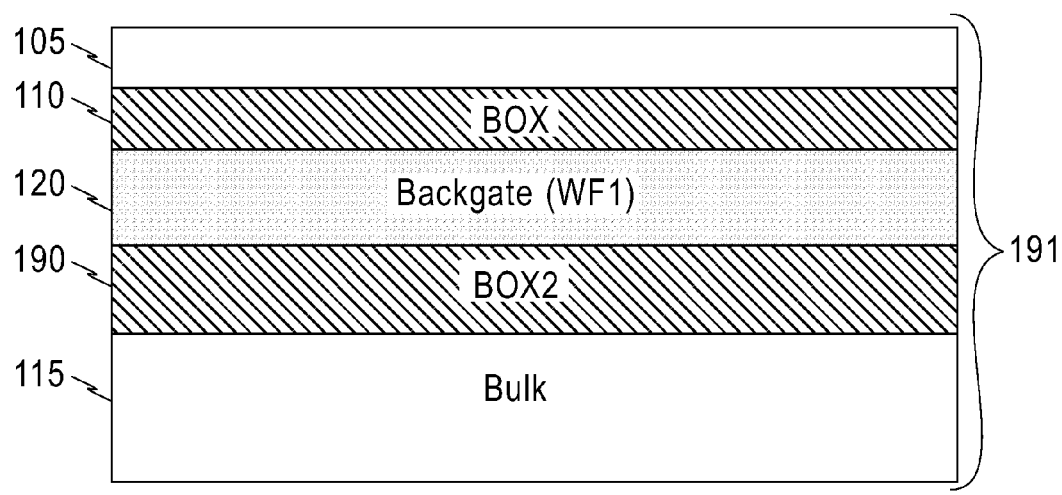
FIG. 7 illustrates a "double-BOX" SOI substrate having a metal backgate at a starting point of method according to an another embodiment of the present invention.
Figure 8:
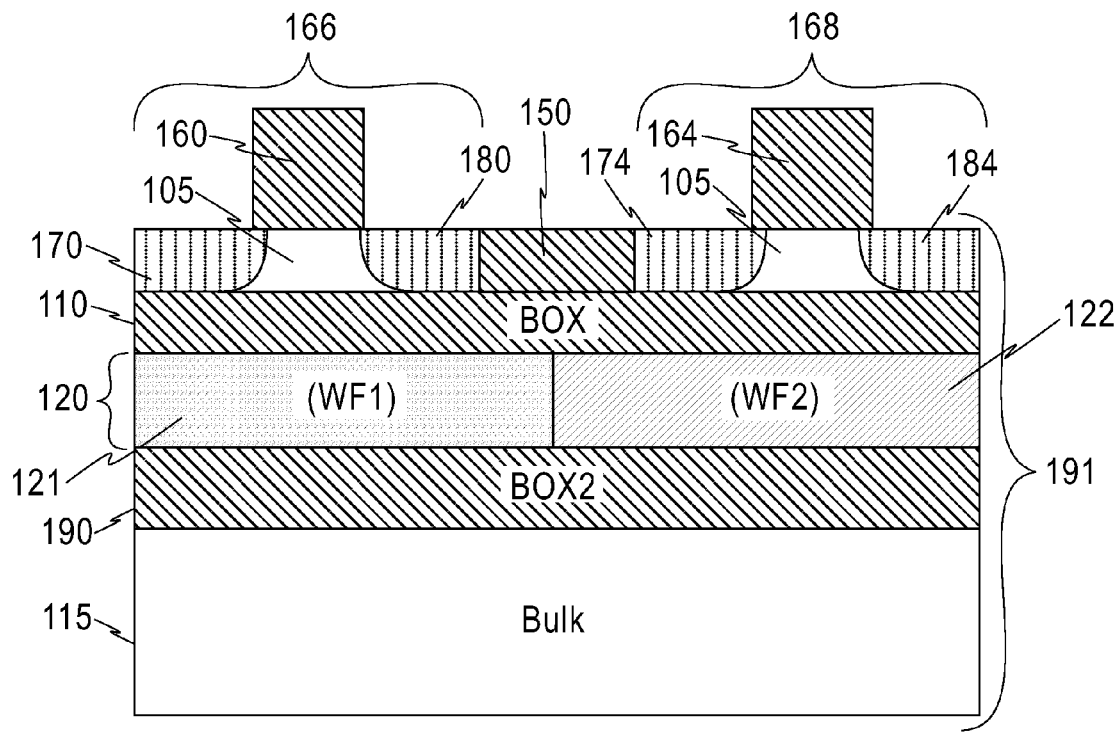
FIG. 8 illustrates a "double-BOX" substrate having a metal backgate with two regions and transistors aligned over the two regions according to an another embodiment of the present invention.

Furthermore, the above method of making a substrate with two (or more) work function regions, may also be performed starting with a "double-BOX" substrate 191 illustrated in FIG. 7. Here, there is a second buried insulator (second BOX) 190 layer interposed between the original metal backgate 120 and the bulk 115. FIG. 8 illustrates a double-BOX substrate 191 having first and second field effect transistors regions (166 and 168, respectively) formed by the method above. An advantage of a double-BOX substrate is that metal backgate regions with different (or same) work functions can be isolated from each other, thus allowing different voltages to be applied to different metal backgate regions. For example, in FIG. 8, a first voltage can be applied to the metal backgate 120 first region 121 having WF1 while a second (different) voltage can be applied to the metal backgate 120 second region 122 having a second work function (WF2).

While FIGS. 6 and 8 show the source and drain regions as being in the same plane as the substrate 100, raised source drains are also within the scope of the present invention. Ways to make a source and a drain, include, but are not limited to: (1) growing an in-situ doped raised source and drain followed by annealing; (2) implanting ions into a substrate followed by annealing; (3) growing a raised source and drain, implanting ions into the raised source and drain, followed by annealing, and (4) any suitable combination of those ways. Any of the methods of forming the source/drains may employ optional off-set spacers formed on the gate stack prior to source/drain formation. The optional off-set spacers can be made from silicon nitride ($Si_xN_y$), silicon oxides ($SiO_x$) or other dielectric materials.

Still referring to FIGS. 6 and 8, while the gate stack(s) 160, 164 are shown as a single rectangle, they are preferably composed of multiple materials, and even more preferably, the materials are stacked in layers. The gate stacks 160, 164 may be top gate electrodes or dummy gates (described in a later section).

If the gate stack(s) 160, 164 are a top gate electrodes, then the gates stacks 160, 164 layers include a gate insulator and a gate conductor. A bottom layer is the gate insulator which can be a silicon oxide, silicon oxynitride or high dielectric constant (herein "high-k") material. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k may further include dopants such as lanthanum, aluminum. High-k material can be deposited by any suitable process, including but not limited to, atomic layer deposition (ALD), molecular layer deposition (MLD), chemical vapor deposition (CVD), plasma enhanced chemical vapor deposition (PECVD), high density plasma chemical vapor deposition (HDPCVD), rapid thermal chemical vapor deposition (RTCVD), in-situ radical assisted deposition, ultrahigh vacuum chemical vapor deposition (UHVCVD), metal organic chemical vapor deposition (MOCVD), molecular beam epitaxy (MBE), physical vapor deposition, sputtering, evaporation, ion beam deposition, electron beam deposition, laser assisted deposition, chemical solution deposition, or any combination of those methods. The high-k thickness may range from 0.5 nm to 3 nm or any other range in between. An interfacial layer such as silicon oxide, silicon nitride, silicon oxynitride may be formed on the SOI layer 305 before high-k deposition. A layer above the gate insulator may be a gate conductor of the gate stack 160 when the gate stack is a top gate electrode. Suitable gate conductor materials can include, but are not limited to, doped polycrystalline or amorphous silicon, germanium, silicon germanium, a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tungsten silicide, tungsten nitride, ruthenium oxide, cobalt silicide, nickel silicide), carbon nanotube, conductive carbon, or any suitable combination of these materials. The conductive material can further include dopants that are incorporated during or after deposition. Suitable processes described above for high-k deposition can be used for forming the gate conductor. The thickness of the patterned gate stack 160,164 may range from about 10 nm to about 100 nm or any other range in between.

The patterned gate stack 160, 164 may also include a sidewall spacer (not shown), made of silicon containing insulator film, preferably silicon dioxide or silicon nitride or combination of layers of those films.

Methods of Tuning Metal Backgate Work-Function During Device Fabrication

Figure 9:
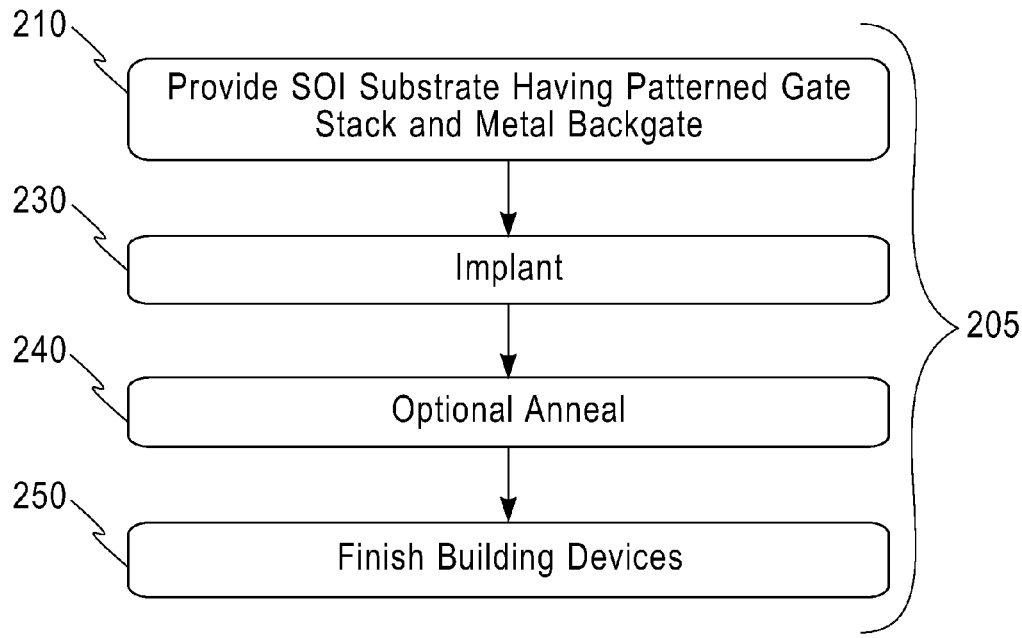
FIG. 9 is a flow chart of steps to create a substrate having a metal backgate with two regions according to a further embodiment of the present invention.

FIG. 9 is a flow chart 205 with the steps of tuning a metal backgate during device fabrication to form at least two work function regions according to one embodiment. Step 210 is providing a substrate with a patterned gate stack and metal backgate; the step 230 is ion implanting the substrate; the step 240 is optionally annealing; step 250 is finish building the device. Each of the steps, and the resulting structures, will be discussed in detail below. Those skilled in the art will recognize that the step number (10, 20, 30, etc.) does not necessarily indicate an order to perform the step; rather the step numbers are a means of step identification.

Figure 10:
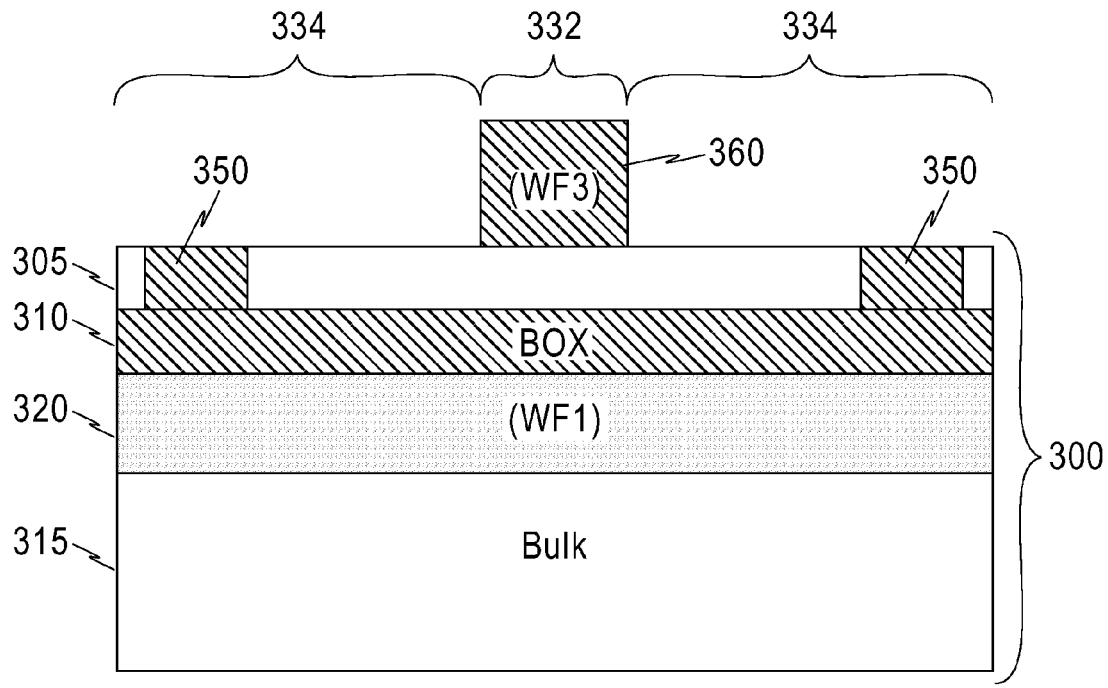
FIG. 10 illustrates an SOI substrate having a metal backgate and patterned gate stack at a starting point of method according to a further embodiment of the present invention.

Step 210 of tuning a metal backgate 320 during device fabrication to form at least two work function regions is providing a substrate 300 as shown in FIG. 10. The substrate 300 can be a semiconductor on insulator substrate (SOI), and preferably an extremely thin semiconductor on insulator substrate (ETSOI). The substrate 300, because device fabrication is in process, already has shallow trench isolation regions 350 formed and a patterned gate stack 360.

Referring to FIG. 10, the parts of the SOI substrate 300, namely the bulk 315, BOX 310, and SOI layer 305 are the same as described in conjunction with FIG. 2 with regard to the bulk, 115, BOX, 110 and SOI layers 105 and will not be repeated here. Furthermore, the metal backgate 320 of FIG. 10 also is the same as described in conjunction with metal backgate 120 of FIG. 2 and will not be repeated here. Again referring to FIG. 10, a patterned gate stack 360 has been formed using conventional patterning techniques.

Still referring to FIG. 10, the patterned gate stack 360 serves as a mask for the work function tuning ion implantation. The patterned gate stack 360 results in a masked region 332 and an unmasked region 334 of the substrate.

Note that the process described here can be used with either a gate-first or a gate-last device build integration approach as known in the art. In the gate-first approach, gate stack is a top gate electrode and is formed before the source and drain regions are created; whereas in a gate-last approach, the gate stack is a dummy gate structure. The dummy gate is first formed, and then the source/drain regions are formed. Finally the dummy gate is removed and the cavity created as a result of removing the dummy gate is filled with the desired top gate material.

In the gate first approach, the gate stack 360 is a top gate electrode and the materials are the same as described in conjunction with FIG. 6 reference numeral 160 and will not be repeated here, with the exception that an optional dielectric hard mask may be placed on top of the gate stack. When present, the dielectric hard mask will protect the gate electrode from the tuning ion implantation and thus prevent work function changes in the gate stack 360. This hard mask is removed later when contacts are formed to the gate and source/drain regions.

Dielectric hard mask materials include silicon nitrides, silicon oxides, silicon oxynitrides, silicon carbides, silicon oxycarbides and combinations thereof. Alternatively, if a gate-first approach without a dielectric hard mask is used, then the work function tuning ion implantation alters the work function of both the backgate and the top gate (gate stack 360) as explained later.

When the gate last approach is used, the gate stack 360 is a dummy gate stack. A dummy gate stack is preferably composed of multiple materials, and even more preferably, the materials are stacked in layers. For example, the dummy gate stack may be formed of silicon nitride ($Si_xN_yH_z$) on top of a thin oxide (preferably $Si_xO_yH_z$); or a nitride cap ($Si_xN_yH_z$) on polysilicon. In either case, a dummy gate dielectric (preferably $Si_xO_yH_z$) may be between the dummy gate and the SOI layer. Other variants of the materials and ordering of the layers are also acceptable as long as the final (top) layer of the dummy gate stack has sufficient stopping (etch or CMP) properties. The overall height of the dummy gate may range from about 20 nm to about 100 nm or any other range in between. In an embodiment in which raised source/drains are used, the overall height of the dummy gate (sum of height of dummy gate dielectric if any, and dummy gate) must exceed the height of the raised source/drains.

Typically, the overall gate height exceeds the raised source drains by about 5 nm to about 40 nm or any other range in between. Preferably, the overall gate height exceeds the raised source drain height by about 15 nm to about 30 nm and ranges therebetween. Note, the height of the raised source drains can range from about 10 nm to about 50 nm or any other range in between, and is preferably from about 20 nm to about 30 nm and ranges therebetween.

Figure 11:
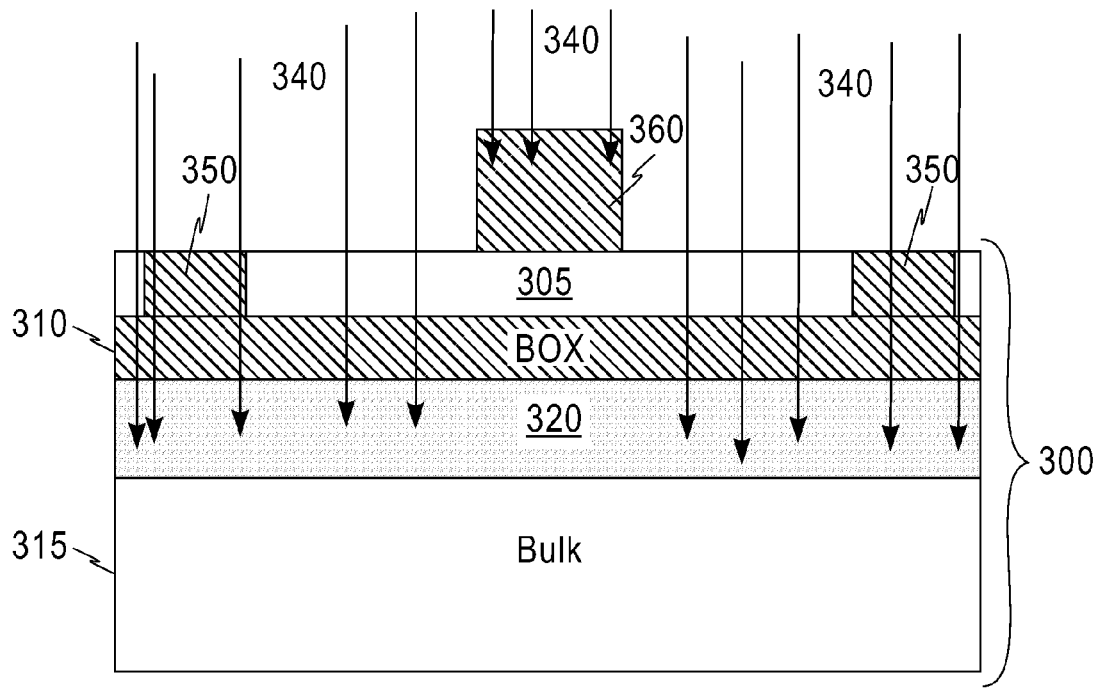
FIG. 11 illustrates ion implanting the substrate using the patterned gate stack as a mask according to a further embodiment of the present invention.

Referring to FIG. 11, ions are implanted 340 into the surface of the substrate. The gate stack 360, acting as a mask, blocks the ions from entering the substrate in the masked region 332. However, in the unmasked region 334, the ions enter the substrate and penetrate to the metal backgate 120. The implant species, dose and energy is the same described in conjunction with FIG. 4 and will not be repeated here.

After implantation, the substrate is optionally annealed. The anneal is the same described earlier and the description will not be repeated here.

Figure 12:
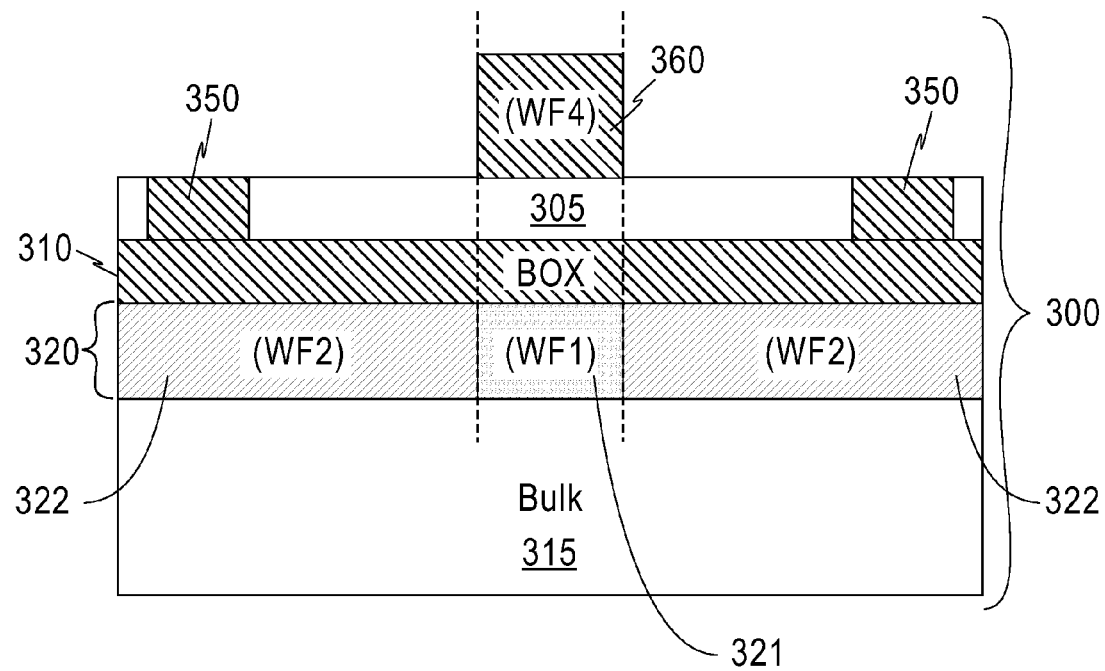
FIG. 12 illustrates a substrate having a metal backgate with two work function regions wherein a first region is aligned under a gate stack region according to a further embodiment of the present invention.

Referring to FIG. 12, a substrate 300 after implanting and optionally annealing is shown. Implanting with the pattern gate stack 360 in place and optionally annealing the metal backgate 320 creates two regions in the metal backgate 320: a first region 321 shielded from the implantation by the gate stack 360 (acting as a mask) and second regions 322 which received the implanted species. The implantation and optional anneal alters the work function of the implanted, second regions 322. As a result, the first region 321 of the metal backgate 320 retains the original or first work function (WF1) while the second regions 322 have a different second work function (WF2).

The magnitude and direction of the work function change depends upon the materials used as the backgate 320, the implant conditions, and the annealing conditions as previously described and will not be repeated here.

In addition, when using the gate-first integration scheme without a dielectric hard mask over the gate stack 360, the work function of the materials in the gate stack 360 may change from their original gate stack work function (herein referred to as "WF3", see FIG. 10) to a second gate stack work function (herein referred to as "WF4", see FIG. 12). The gate stack work functions are different from each other, or in other words, W3 does not equal W4. The gate stack work functions may be the same or different than WF1 or WF2 of the metal backgate regions 321 and 322, respectively. As a result, there can be two or three different work functions in the same transistor on a substrate.

Furthermore, a change in the work function of the gate stack 360 material will have an effect on Vt. Thus, when using the gate stack 360 without dielectric hard mask on top of it, the work function is altered at both the gate stack 360 and at the backgate regions 321 and 322, resulting in multiple "knobs" with which to adjust Vt of a transistor.

A summary of work function and doping combinations possible by the embodiments described in FIGS. 9-12 is given in Table 1.

TABLE 1

| Gate Stack (360) = | Backgate Work Function and (Doping) | | | Top Gate Work Function |
|---|---|---|---|---|
| | Second Region (322) S/D Region | First Region (321) Channel Region | Second Region (322) S/D Region | |
| Top Gate | WF2 (doped) | WF1 (undoped) | WF2 (doped) | WF4 (doped) |
| Top Gate with Hard Mask | WF2 (doped) | WF1 (undoped) | WF2 (doped) | WF3 (undoped) |
| Dummy Gate | WF2 (doped) | WF1 (undoped) | WF2 (doped) | Not Applicable |

Figure 13:
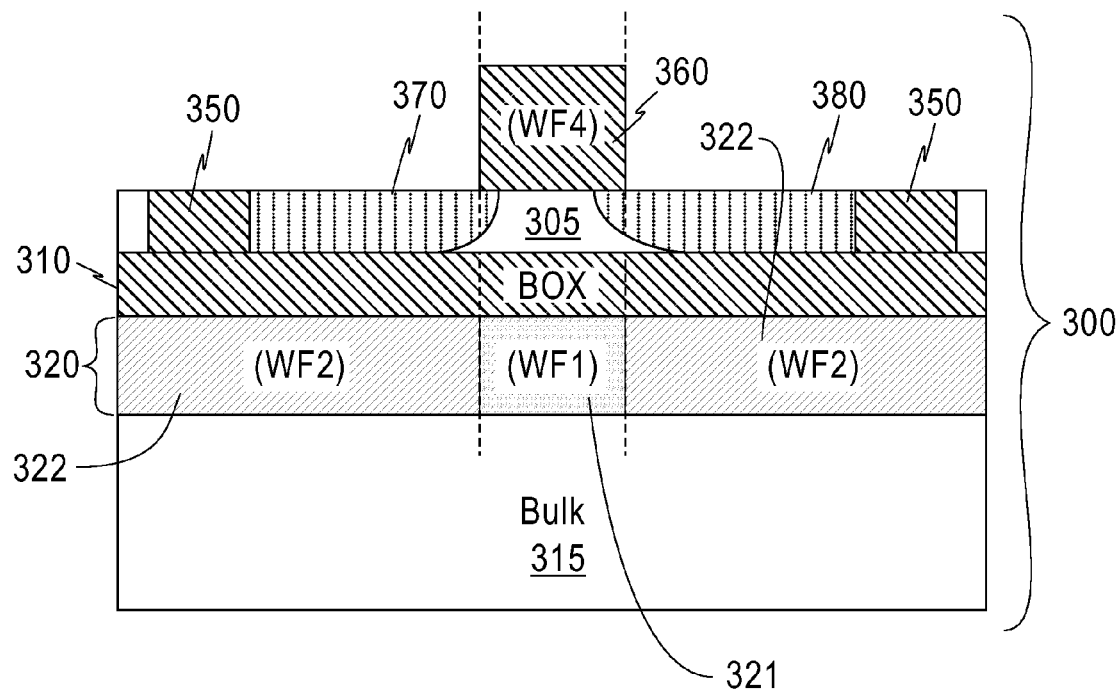
FIG. 13 illustrates a transistor with the channel region aligned over a metal backgate first region having a first work function and the source/drain regions aligned over a metal backgate second region having a second work function.

Referring to FIG. 13, the substrate having a metal backgate 320 with two regions is shown after subsequent normal device build steps, including forming a first source 370 and drain 380 regions (as discussed earlier, these can be raised source/drains). As a result of the build steps, the metal backgate 320 shielded by the gate stack 360 during ion implantation retains its original work function (WF1), thus, it is a first region 321. The metal backgate not shielded by the gate stack 360 (i.e. unmasked region 334) during ion implantation has ions implanted into it. The implanted region of the metal backgate 320 becomes a second region 322. Due to the implantation and optional anneal, the work function in the second region 322 changes to a second work function (WF2).

Thus, in this embodiment in which the gate stack 360 acts as a mask, the metal backgate 320 of the first region 321 having WF1 is aligned under the gate stack 360 and the metal backgate 320 of the second region 322 having WF2 is under the source 370 and drain 380 regions of the same transistor. In this way, the metal backgate under the channel region (i.e. the SOI layer 305 under the gate stack 360) of the transistor has a different work function than the metal backgate under the source 370 and drain 380 regions. Stated another way, the channel region has a WF1 metal backgate and the source/drain regions have a WF2 metal backgate.

An advantage of the structure illustrated in FIG. 13, is that by having a first region 321 with WF1 associated with the channel region (i.e. the SOI layer 305 under the gate stack 360), and a second region 322 with WF2 associated with the source 370 and drain 380 regions of the same transistor, GIDL can be reduced by adjusting the two work functions. For example, in an nFET, a higher work function is used under the channel to increase Vt and reduce leakage, while a lower work function is used under the source/drain to reduce electric field and GIDL. Thus, in a preferred embodiment for an nFET, the first region 321 work function (WF1) is greater than the work function (WF2) of the second region 322. Or stated another way, for an nFET, the work function associated with the channel region is greater than the work function associated with the source/drain regions. If the device is a pFET, the opposite is true; meaning, the lower work function is used under the channel to increase Vt and reduce leakage, while a higher work function is used under the source/drain to reduce electric field and GIDL. Thus, for a pFET, the first region 321 work function (WF1) is less than the work function (WF2) of the second region 322.

Figure 14:
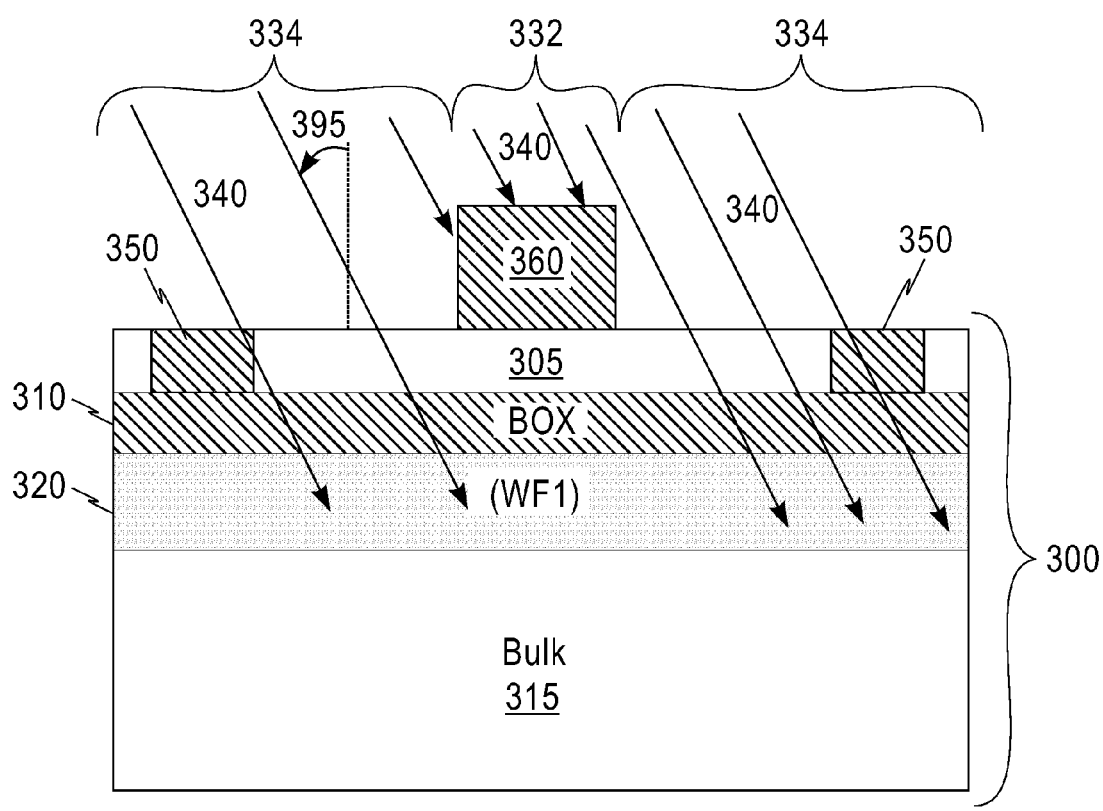
FIG. 14 illustrates ion implanting the substrate with a tilt angle using the patterned gate stack as a mask according to yet another embodiment of the present invention.
Figure 15:
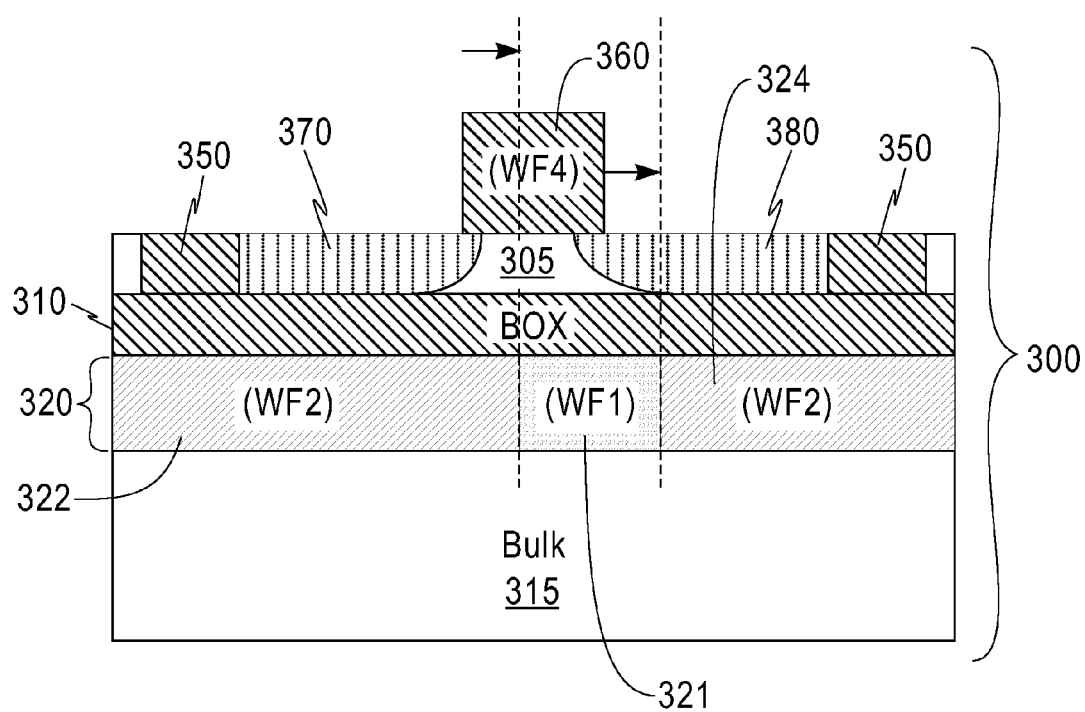
FIG. 15 illustrates a substrate having a metal backgate with two work function regions asymmetrically aligned under a patterned gate stack according to yet another embodiment of the present invention.

FIG. 14 illustrates an alternative way of implanting ions. In this embodiment, instead of implanting the ions substantially perpendicular to the substrate, the ion implantation 340 is tilted. Again, the gate stack 360 acts as a mask, but because the trajectory of the ions is angled, some ions are able to penetrate underneath masked regions 332 while unmasked regions 334 are shadowed by the mask and receive no implantation. Thus, a tilted work function tuning implantation shifts the metal backgate 320 first region 321 as shown in FIG. 15.

As illustrated in FIG. 14, the tilt angle 395 is measured relative to a line perpendicular to the substrate surface. In FIG. 14, the angle 395 (denoted by the curved arrow) is negative (to the left) relative to a dotted perpendicular line. When the angle 395 is negative, the metal backgate 320 first region 321 is shifted to the right (See FIG. 15 with arrows pointing to dotted lines indicating the amount of shift). When the angle 395 is positive, the first work function 321 region is shifted to the left. Thus opposite tilt angles result in opposite shift directions.

Tilt angles 395 may range from about 0 degrees to about 45 degrees, and ranges therebetween and are preferably about 20. The amount of shift will depend on a variety of factors including, but not limited to, the height of the gate stack 360, gate stack 360 materials, the tilt angle 395, implantation species, implantation energy, anneal conditions, and substrate 300 material and thicknesses.

Again referring to FIG. 15, a tilt angle implantation allows the first region 321 to be shifted such that the right and left side of a device have different work functions. For example, in FIG. 15, the source 370 overlays a metal backgate 320 second region 322, whereas the gate stack 360 does not overlay a single region, instead is spans both regions (321 and 322). In addition, the drain 380 overlays with at least a portion of the first region 321. Such an asymmetrically aligned structure can enhance device performance by reducing DIBL and GIDL.

DIBL is a short channel effect. Ideally, the gate completely controls the on/off state of a transistor, but in reality, the drain also has an influence. The influence of the drain in controlling the on/off state of the transistor is referred to as DIBL. In a desired state, the drain control over the on/off state of a transistor is minimal, and thus ideally, for long channel devices DIBL equals 0 mV. Therefore, for a transistor operating in the linear regime the voltage threshold is determined by the work function under the channel (i.e. the SOI layer 305 under gate stack 360). However, while in saturation regime, Vt is determined more by the work function near the source 370 side of the channel. Therefore, if the device in FIG. 15 is an nFET and has a metal backgate 320 second region 322 with a higher work function than that of the metal backgate 320 first region 321 (meaning WF2>WF1), the device has smaller DIBL than a device with a single backgate region having a uniform work function.

GIDL is the extra leakage as a result of band-to-band tunneling at the drain-side of the channel and at high drain voltages. Ideally, the only leakage mechanism that defines the channel current in the off state is the sub-threshold leakage which decreases exponentially as the gate voltage is decreased. However, at high drain voltage and low gate voltage the electric filed at the drain-side of the channel is high enough to result in band-to-band tunneling. Unlike sub-threshold leakage, GIDL increases as the gate voltage is decreased. The device pictured in FIG. 15 also has smaller GIDL than a uniform device because the electric field near the drain 380 side is smaller than a uniform backgate with the second work function region. Here, "uniform" refers to a backgate with a single work function, as opposed to a backgate with different regions having different work functions.

It should be noted that the methods of tuning metal backgate work function during device fabrication as explained in conjunction with FIGS. 9-15 could also be carried out on "double-box" substrate pictured in FIG. 7.

The prior sections described embodiments applicable to both gate first integration schemes and gate-last integration schemes. The next section describes embodiments specific to gate-last methods of making devices. In a gate-last method a dummy gate structure is first formed, and then the source/drain regions are formed followed by a dielectric layer which is co-planar with the dummy gate. Finally the dummy gate is removed and the cavity created as a result of removing the dummy gate is filled with the desired top gate material. Due to removal of the dummy gate, there are more variations of the work function tuning method and resulting structures which can be created when using a gate last process. The variations are further described below.

Figure 16:
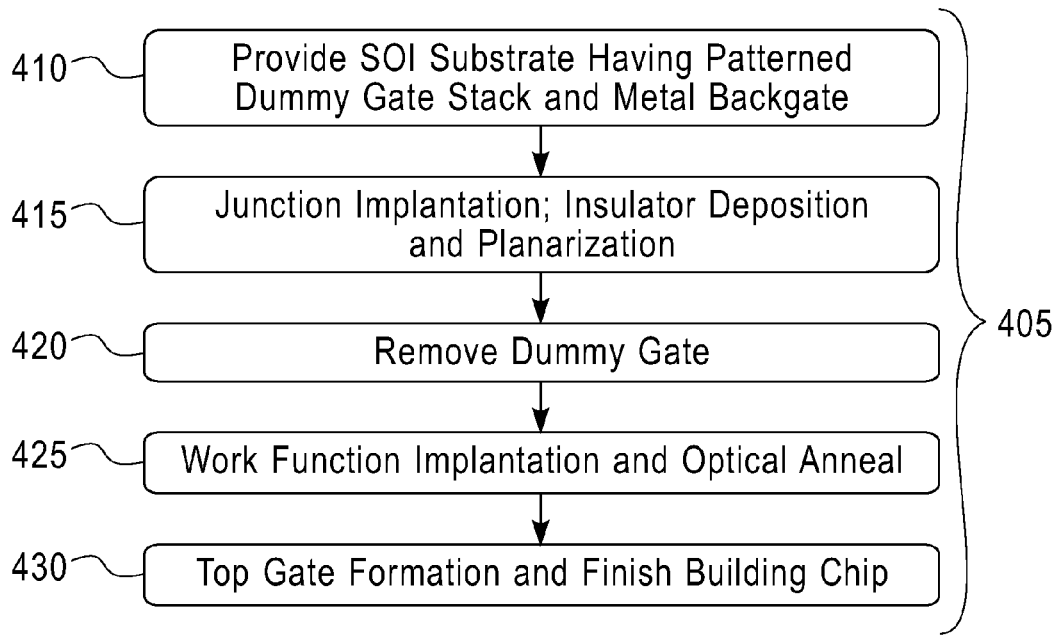
FIG. 16 is a flow chart with steps of tuning a metal backgate during device fabrication using a gate-last process to form at least two work function regions according to an embodiment of the present invention.

FIG. 16 is a flow chart 405 with the steps of tuning a metal backgate during device fabrication using a gate-last process to form at least two work function regions. Step 410 is providing a substrate with a patterned (dummy) gate stack and metal backgate; step 415 is performing junction implants, depositing an insulator and planarizing it; step 420 is removing the dummy gate stack; step 425 is performing work function ion implantation and optional anneal; step 430 is top gate formation and finish building the device. Each of the steps, and the resulting structures, will be discussed in detail below.

Figure 17:
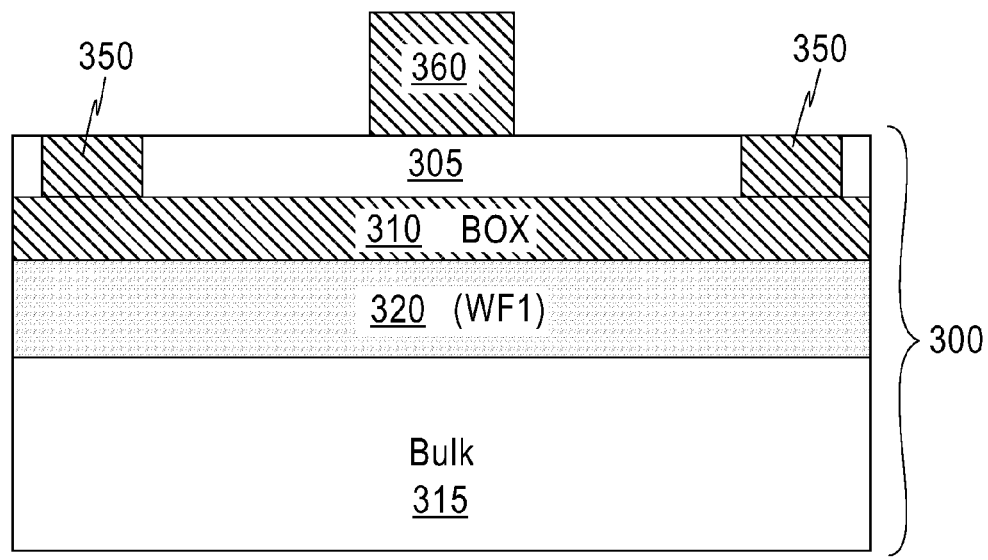
FIG. 17, illustrates a substrate having a dummy gate and metal backgate with an original work function WF1 at a starting point of a method according to an embodiment of the present invention.

Referring to FIG. 17, a substrate is provided having a (dummy) gate stack 360 and metal backgate 320 with work function WF1. The metal backgate 320 is not implanted with a work function tuning implant while the (dummy) gate stack 360 is in place. Thus, initially, the entire metal backgate 320 has a uniform, original work function of WF1.

Figure 18:
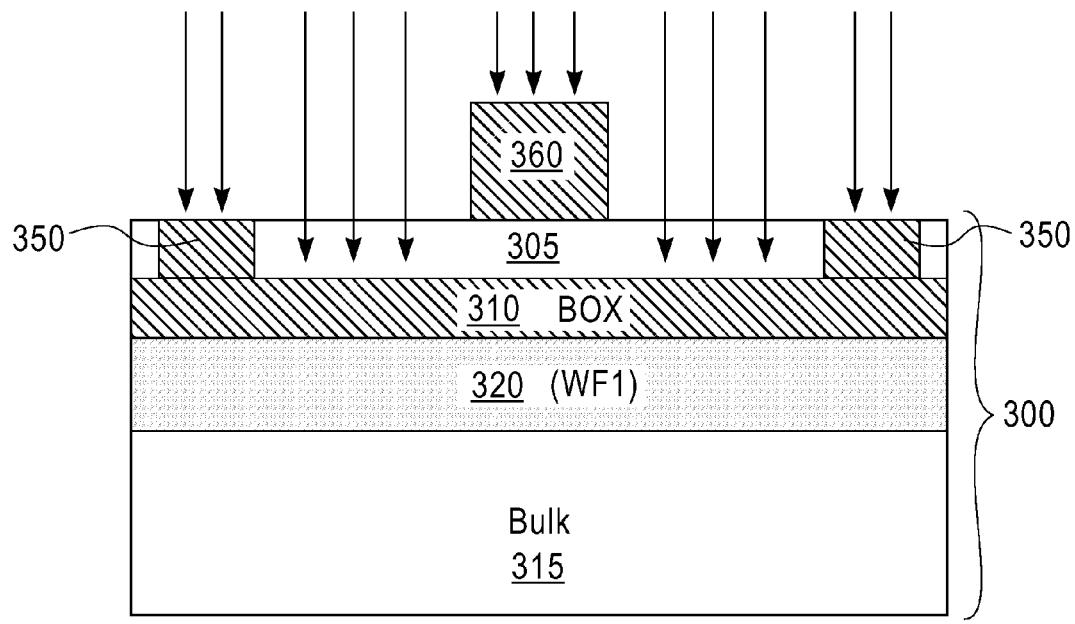
FIG. 18 illustrates a junction implantation step of a method according to an embodiment of the present invention.
Figure 19:
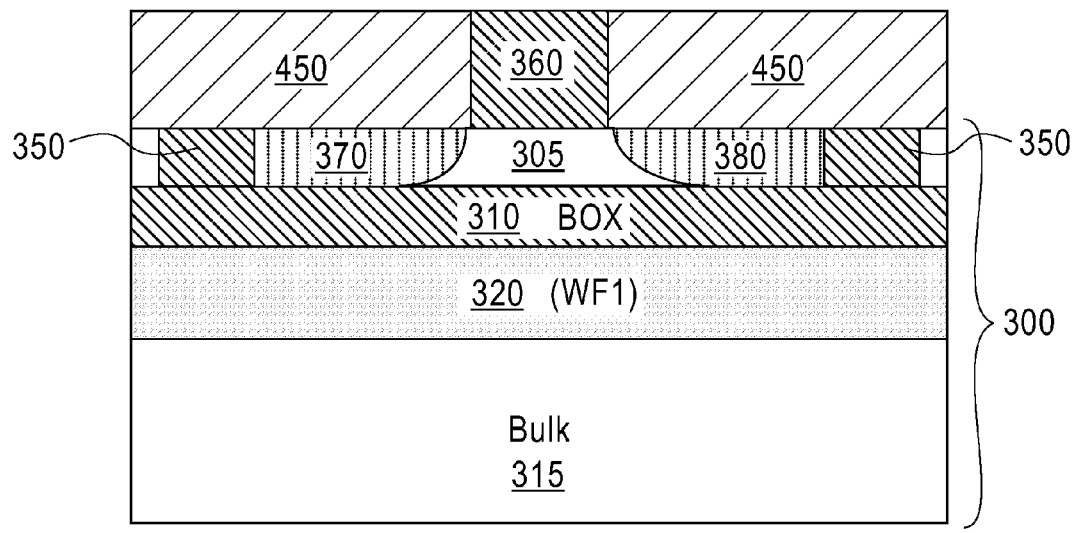
FIG. 19 illustrates a substrate with source drain regions, and an insulator layer co-planar with the dummy gate at an intermediate point of a method according to an embodiment of the present invention.

Referring to FIG. 18 the method continues by performing a junction ion implantation as indicated by the arrows stopping in the SOI layer 105 to form source 370 and drain 380 regions (See FIG. 19). In addition, and still referring to FIG. 19, an insulator layer 450 is formed so as to be co-planar with the (dummy) gate stack 360.

Figure 20:
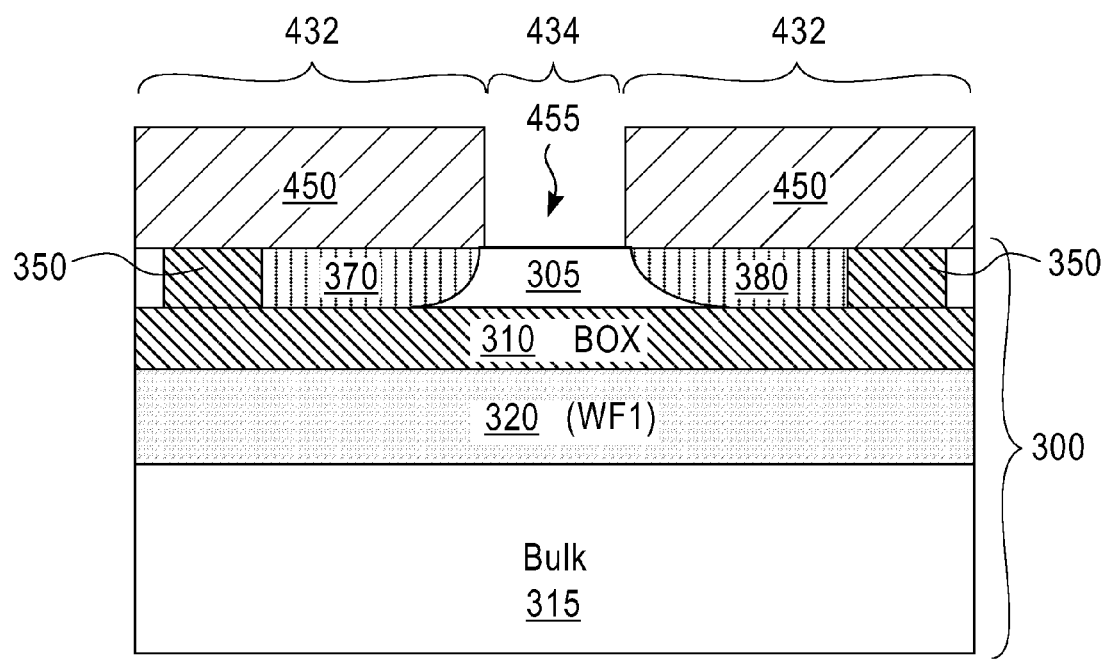
FIG. 20 illustrates a dummy gate opening through the insulator to the substrate at an intermediate point of a method according to an embodiment of the present invention.
Figure 21:
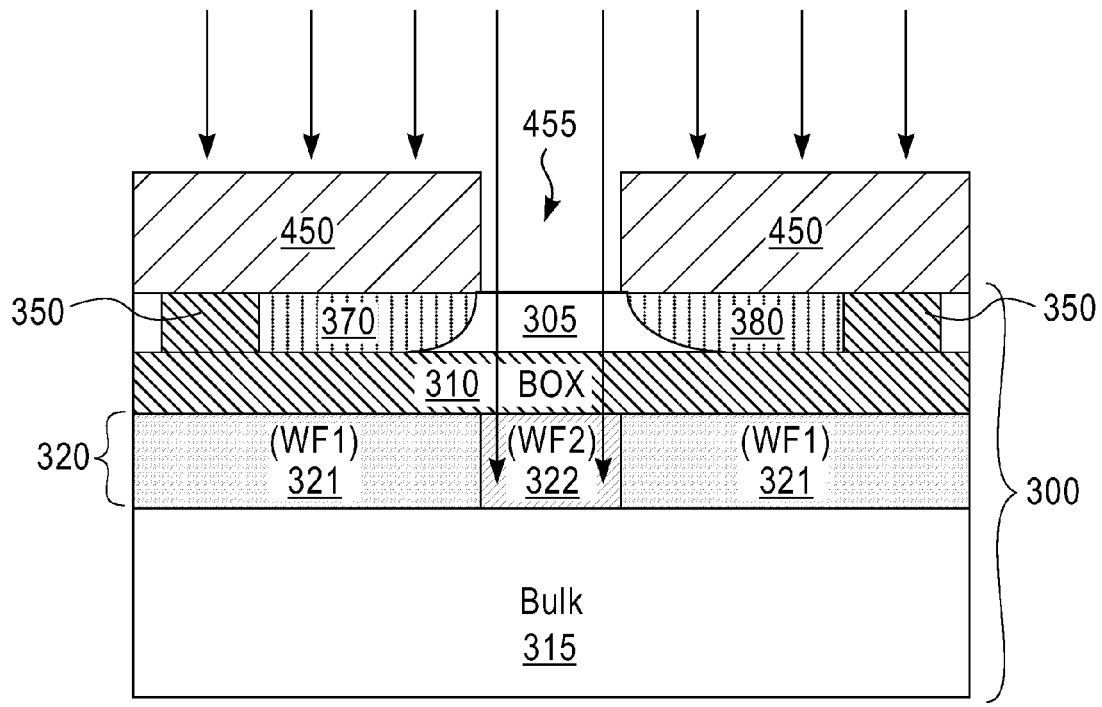
FIG. 21 illustrates the substrate after performing a work function implant through the dummy gate opening according to an embodiment of the present invention.
Figure 22:
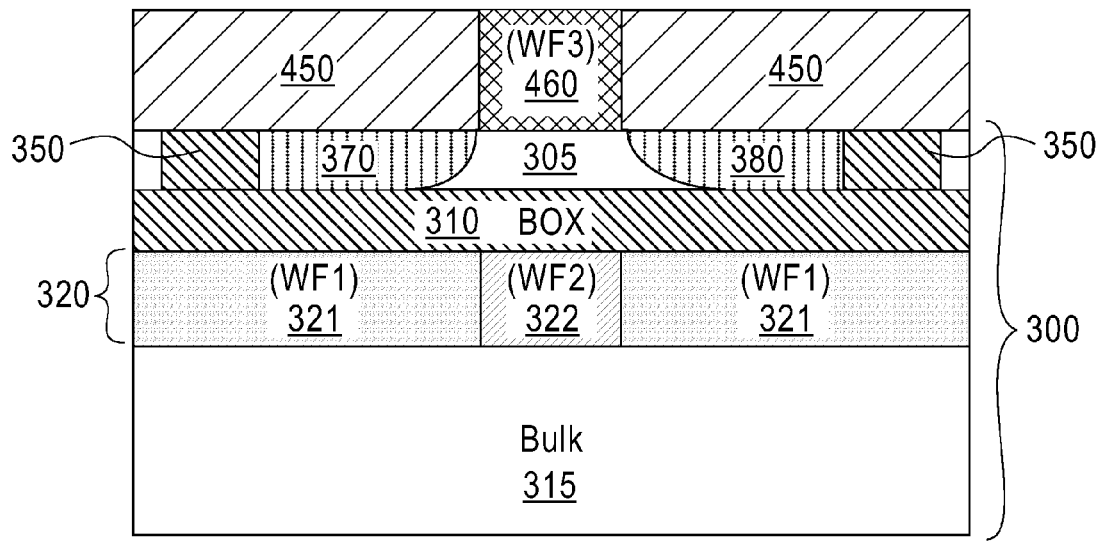
FIG. 22 illustrates a device having two metal backgate work function regions, one undoped with a first or original work function WF1, and one doped with a second, different work function WF2 made by a gate-last process according to an embodiment of the present invention.

Referring to FIG. 20, the (dummy) gate stack 360 is removed to form an opening 455 to the substrate 300. Because the substrate 300 is now exposed (i.e. unmasked) by removing the (dummy) gate stack 360, the work function tuning implant can be performed through the opening 455 left by the dummy gate while other regions are masked by the insulator 450 as illustrated in FIG. 21. The result, shown in FIG. 22, is a first region 321 of the metal backgate 320 and a second region 322 of the metal backgate 320. The first region 321 was masked from the work function implant by the insulator 450. The first region 321 retains the original first work function WF1. The second region 322 of the metal back gate 320 is aligned with the opening left by the dummy gate and was exposed to the work function implantation and therefore acquires a second work function WF2, different from the first work function WF1.

Referring to FIG. 22, the device build continues by forming a top gate electrode which has an original gate work function WF3 which may have a value different from or the same as WF1 or WF2. As a result, a device made by this embodiment of a gate-last process may have up to three different work function values: WF1 in the first region 321 of the metal backgate 320; WF2 in the second region 322 of the metal backgate; and WF3 of the top gate electrode 460.

Figure 23:
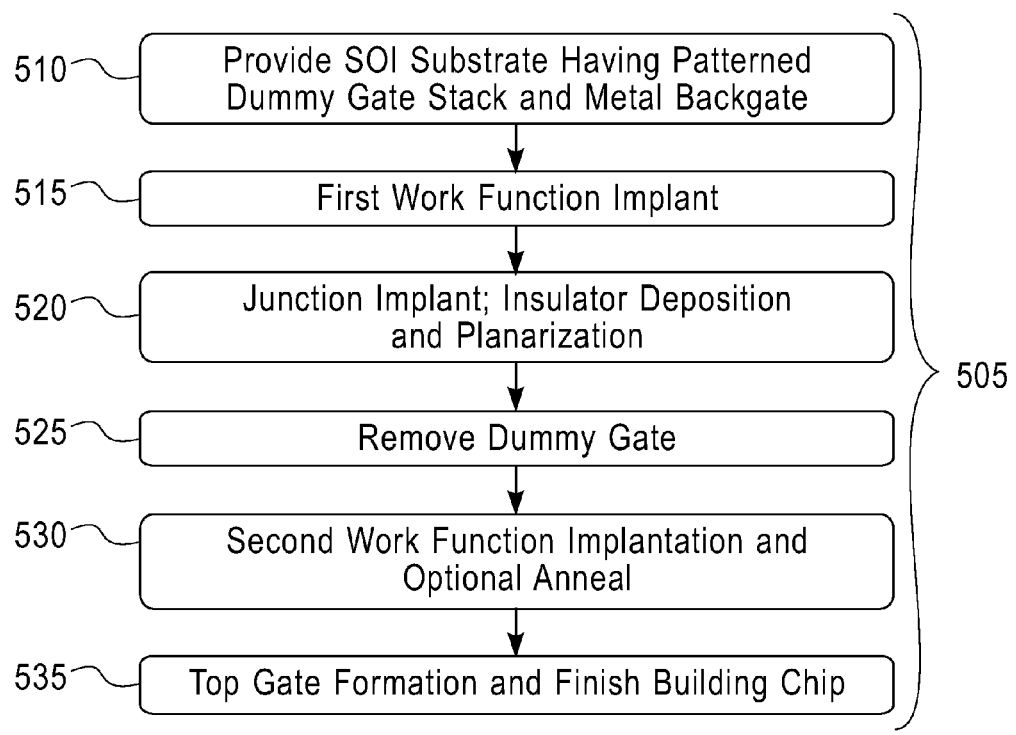
FIG. 23 is a flow chart with the steps of tuning a metal backgate during device fabrication using a dual work function implantation gate-last process to form at least two work function regions according to an embodiment of the present invention.

Referring to FIG. 23 a dual work function tuning embodiment using a gate-last process is shown in flow chart 505. In this embodiment two work function implantations are performed. Step 510 is providing a substrate with a patterned (dummy) gate stack and metal backgate; step 515 is performing a first work function implant; step 520 is performing junction implants and depositing an insulator and planarizing it; step 525 is removing the dummy gate stack; step 530 is a performing a second work function ion implantation and optional anneal; step 535 is top gate formation and finish building the device. Each of the steps, and the resulting structures, will be discussed in detail below.

Figure 24:
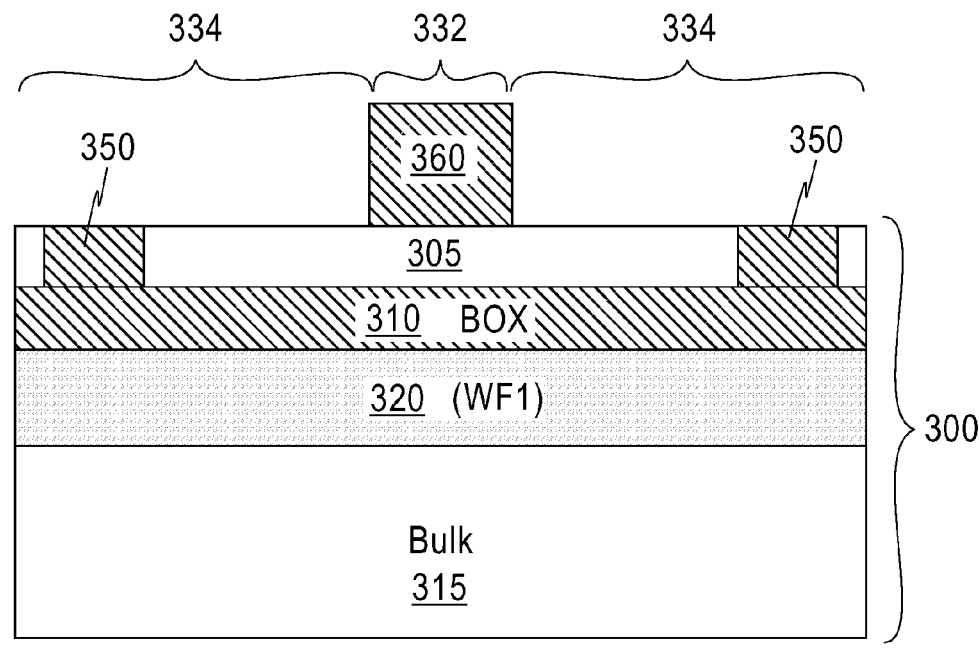
FIG. 24 illustrates a substrate having a dummy gate and metal backgate with an original work function WF1 at a starting point of a method according to an embodiment of the present invention. The dummy gate creates masked and unmasked regions over the substrate.

Referring to FIG. 24, a substrate is provided having a gate stack 360 and metal backgate 320 with work function WF1. Here, the gate stack 360 is a dummy gate. The (dummy) gate stack 360 results in masked regions 332 and unmasked regions 334 over the substrate 300.

Figure 25:
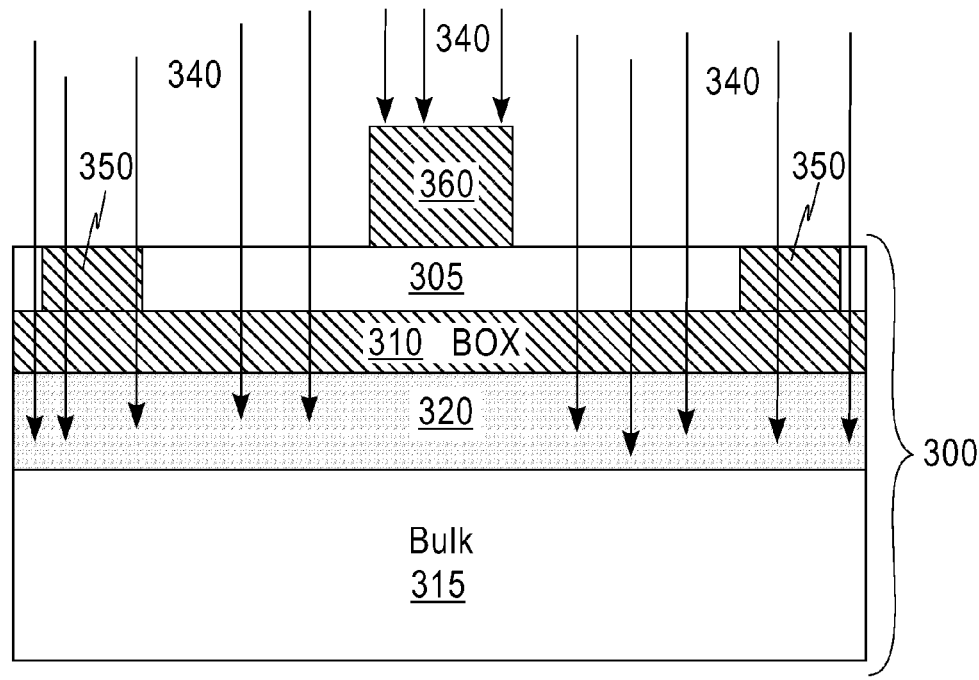
FIG. 25 illustrates a first work function ion implantation according to an embodiment of the present invention.
Figure 26:
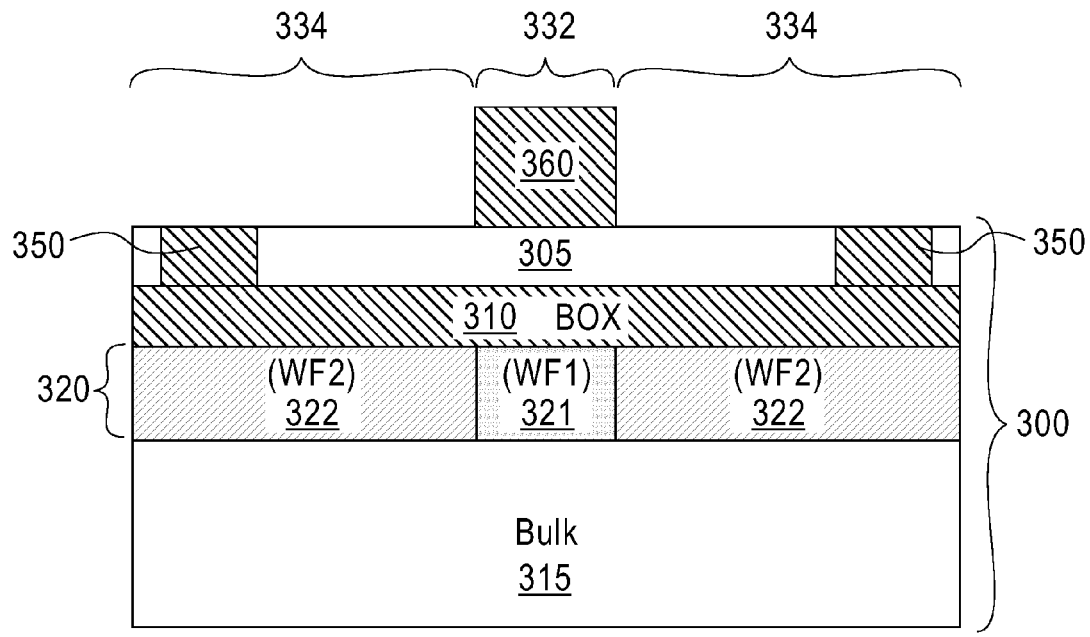
FIG. 26 illustrates two regions in the metal backgate created by the first work function implantation according to an embodiment of the present invention.

Referring to FIG. 25 the method continues by performing a first work function ion implantation as indicated by the arrows stopping in the metal backgate 320. The result, referring to FIG. 26, is the formation of first region 321 and second regions 322 of the metal backgate 320. The first region 321 of the metal backgate 320 was masked by the gate stack 360 and, thus, is undoped and retains its first or original work function WF1. The second region 322 of the metal backgate 320 was under the unmasked 334 region of the substrate and received implanted species. The dopants and optional anneal change the work function in the second region 322 to a second work function WF2. WF2 and WF1 are different from each other.

Figure 27:
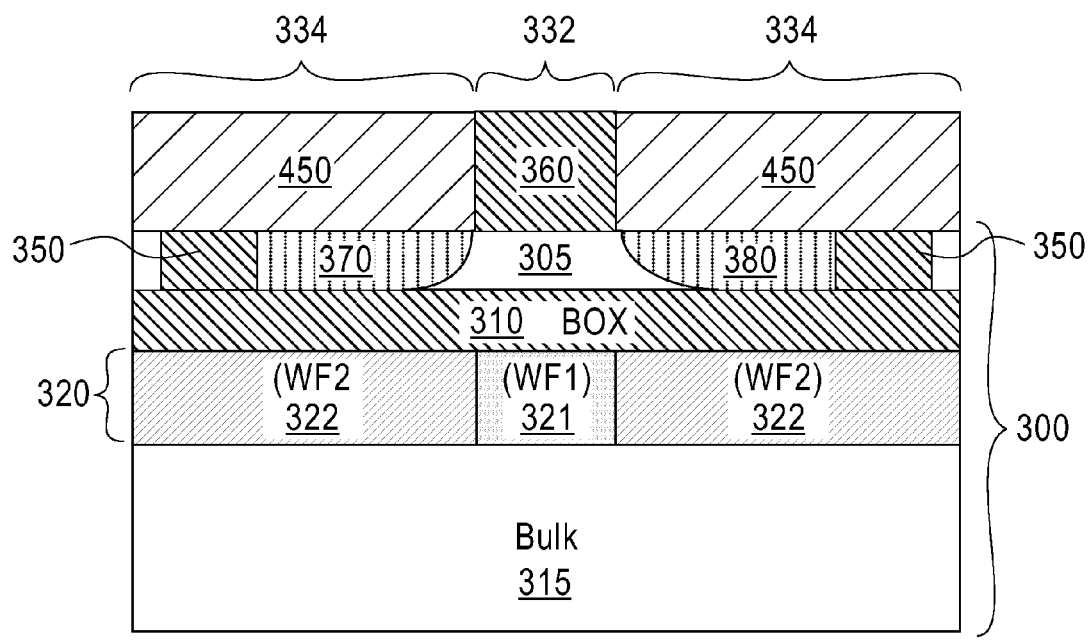
FIG. 27 illustrates the substrate after junction ion implantation and co-planar insulator formation at an intermediate step according to an embodiment of the present invention.

Referring to FIG. 27, the substrate received a junction ion implantation to result is the formation of source 370 and drain 380 regions. In addition, and still referring to FIG. 27, an insulator layer 450 is formed so as to be co-planar with the (dummy) gate stack 360.

Figure 28:
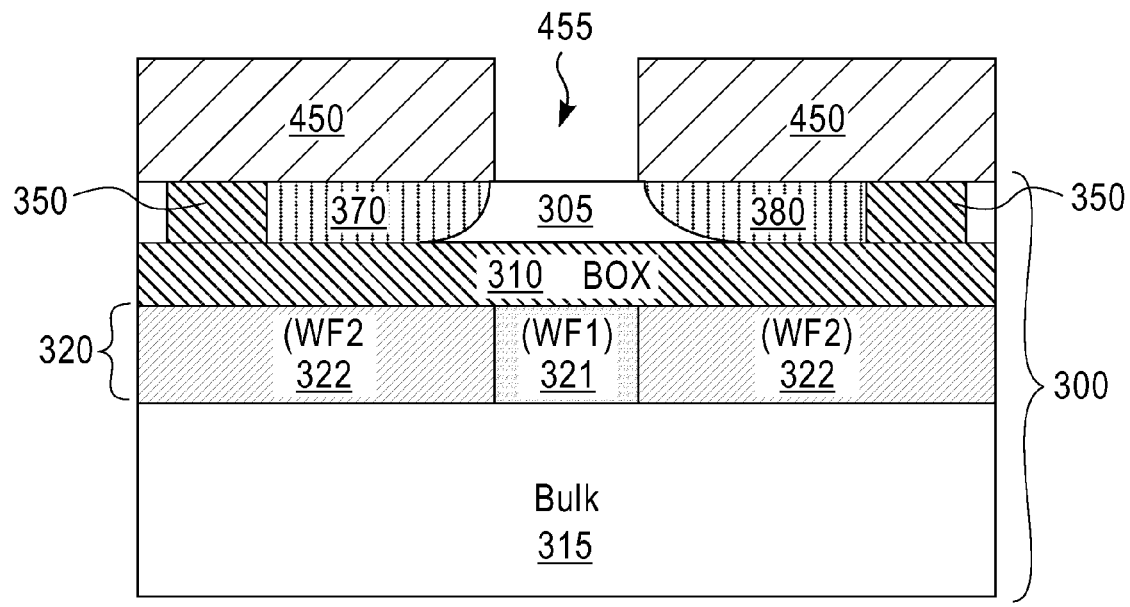
FIG. 28 illustrates the substrate after removing the dummy gate to form an opening to the substrate according to an embodiment of the present invention.
Figure 29:
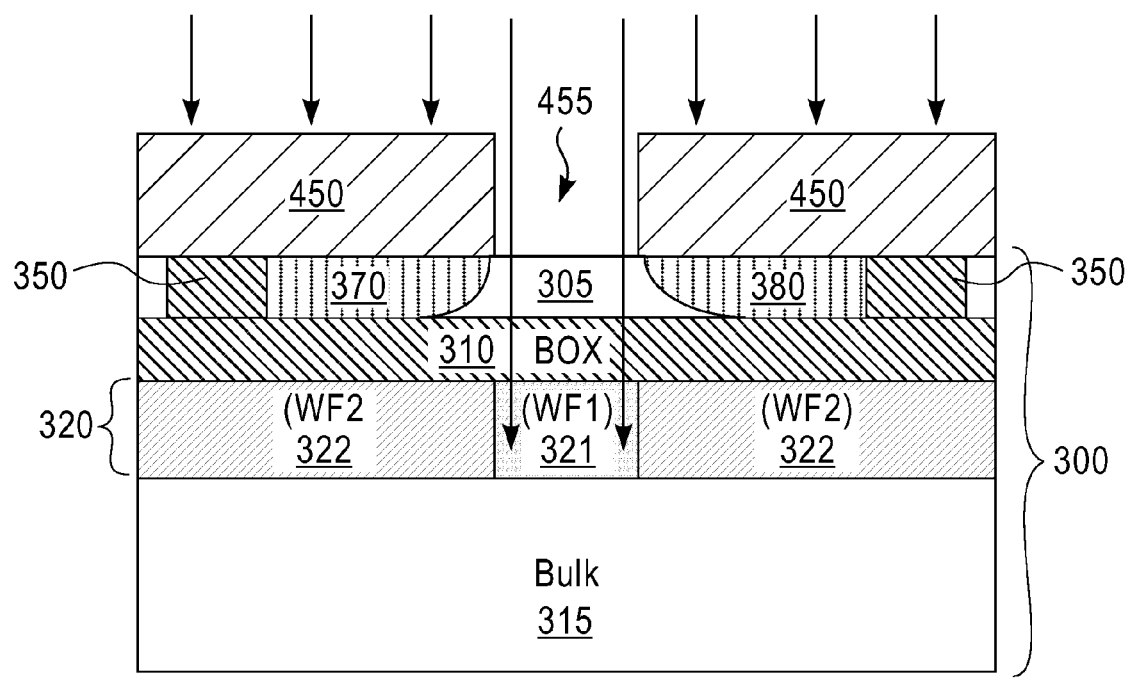
FIG. 29 illustrates a second work function implantation step through the dummy gate opening according to an embodiment of the present invention.
Figure 30:
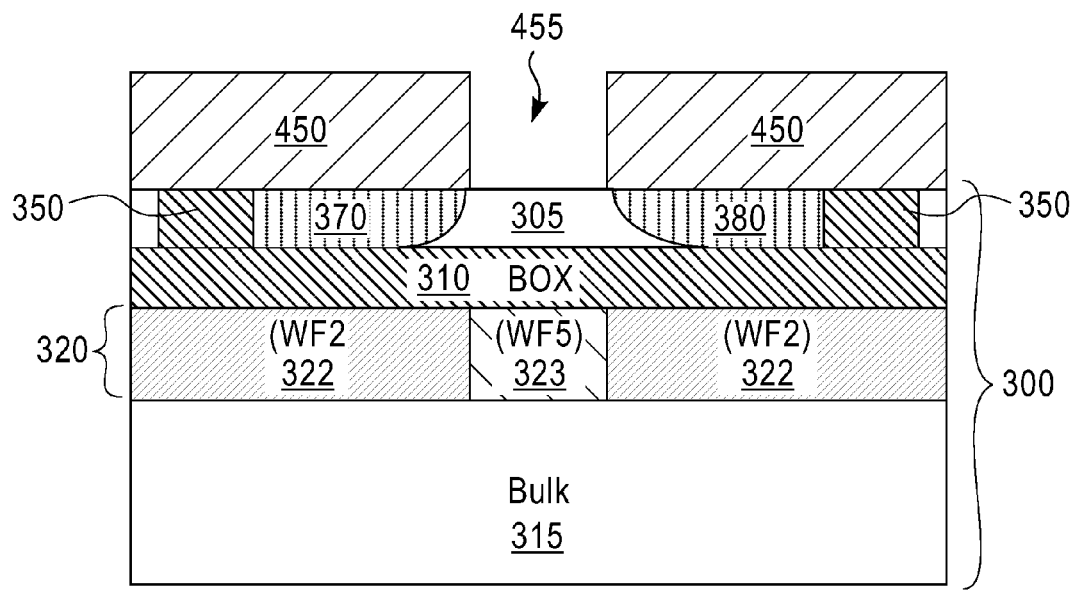
FIG. 30 illustrates a substrate having first and second regions of a metal backgate in which both regions are doped and have different work functions according to an embodiment of the present invention.

Referring to FIG. 28, the (dummy) gate stack 360 is removed to form an opening 455 to the substrate 300. Because the substrate 300 is now exposed (i.e. unmasked) by removing the (dummy) gate stack 360, second work function tuning implant can be performed through the opening 455 left by the dummy gate while other regions are masked by the insulator 450 as illustrated in FIG. 29. Thus the insulator 450 serves as a second mask of the second work function implantation step. The result is that the first region 321 of metal backgate having WF1 shown in FIG. 29 is converted to a third region 323 of the metal backgate 320 having WF5 (See FIG. 30). Still referring to FIG. 30, the second region 322 of the metal backgate 320 having WF2 remains the same because it was masked by insulator 450. The work function value of WF5 is different from WF1 and is preferably different from WF2. Thus, after the second work function implantation, the metal backgate of a single transistor can have up to two different work function regions each of which contains dopants from implantation: a second region 322 having work function WF2 under the source/drain 370/380 of a transistor and a third region 323 which has a work function WF5 under the channel region of the transistor. The channel region is that portion of the SOI layer 105 between the source/drain regions 370/380. The different work function values within the backgate are a result of different dopant concentrations and/or implanted species.

Figure 31:
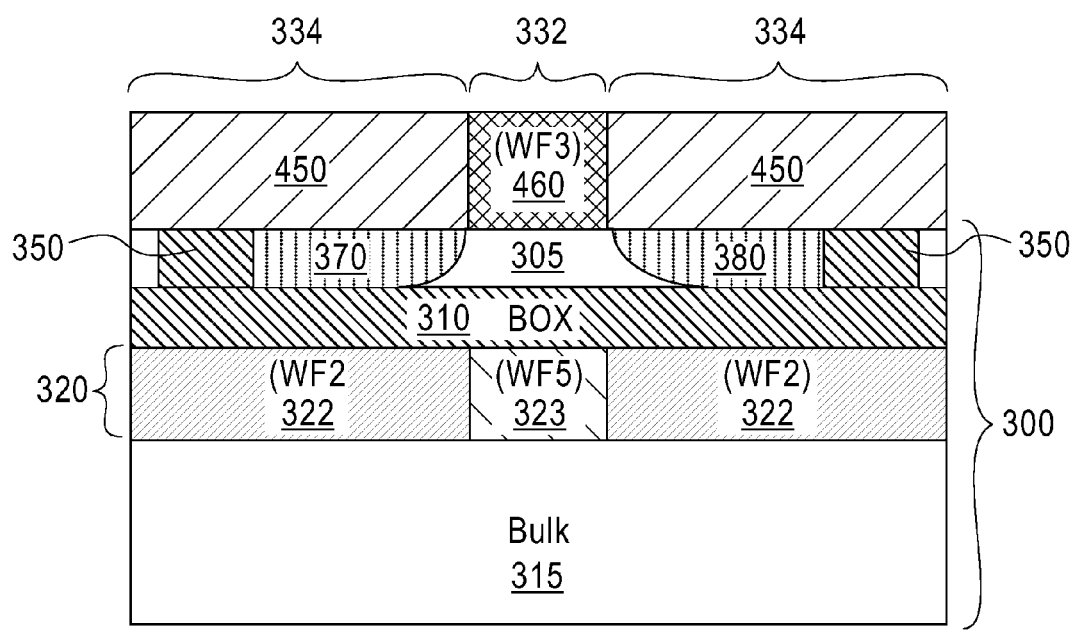
FIG. 31 illustrates a device made according to an embodiment of the dual work function implantation gate-last process having first and second regions of a metal backgate in which both regions are doped and have different work functions.

Referring to FIG. 31, the device build can continue by filling the opening left by the dummy gate with a top gate electrode. The top gate electrode is made of the same material as described in conjunction with FIG. 6 and will not be repeated here. The top gate electrode will have an original gate work function WF3. WF3 of a top gate electrode may have a value the same or different than WF2, or WF5. As a result, a device made by this embodiment of a gate-last process may have up to three different work function values: WF5 in the third region 323 of the metal backgate 320; WF2 in the second region 322 of the metal backgate; and WF3 of the top gate electrode 460.

A summary of work function and doping combinations possible by the embodiments described in FIGS. 16-30 is given in Table 2.

TABLE 2

| | Backgate Work Function (Doping) | | | |
|---|---|---|---|---|
| Gate-Last Process | Second Region (322) S/D Region | First Region (321) Channel Region | Second Region (322) S/D Region | Top Gate Work Function |
| Singe Work Function Implant | WF1 (undoped) | WF2 (doped) | WF1 (undoped) | WF3 (undoped) or WF4 (doped) |
| Dual Work Function Implant | WF2 (doped) | WF5 (doped) | WF2 (doped) | WF3 (undoped) or WF4 (doped) |

This concludes the description of gate-last processes of making MOSFETs with a work function adjusted metal backgate. It should be noted that materials, for example but not limited to dummy gate materials, implantation species (i.e. work function dopants), metal backgate materials, mask materials, previously described also apply to the gate-last process. In addition, a tilt angle work function implantation can be used in a gate-last process as well as a "double-box" substrate.

While the present invention has been described with reference to what are presently considered to be the preferred embodiments, it is to be understood that the invention is not limited to the disclosed embodiments. On the contrary, the invention is intended to cover various modifications and equivalent arrangements included within the spirit and scope of the appended claims. The scope of the following claims is to be accorded the broadcast interpretation so as to encompass all such modifications and equivalent structures and functions.

We claim:

1. A semiconductor on insulator (SOI) substrate comprising:
   a SOI layer;
   a first buried insulator (BOX) under the SOI layer;
   a metal backgate having a first region and a second region located entirely under the first BOX;
   a bulk layer under the metal backgate, wherein the second region of the metal backgate is doped; and
   a first gate stack wherein the first region is asymmetrically aligned under the first gate stack.

2. The SOI substrate of claim 1, wherein the first region has a first work function (WF1) and the second region has a second work function (WF2).

3. The SOI substrate of claim 1, further comprising:
   a second buried insulator (BOX) interposed between the bulk layer and the first and second regions.

4. The SOI substrate of claim 1, wherein the metal backgate comprises a refractory metal.

5. The SOI substrate of claim 1, wherein the metal backgate second region is doped with a species selected from the group consisting of nitrogen, carbon, silicon, fluorine, and chlorine.

6. A semiconductor device comprising:
   a first field effect transistor having a source region, a drain region and a channel region;
   a second field effect transistor; and
   a metal backgate having a first region which lacks a dopant and a second region having a dopant, wherein said metal backgate is located entirely beneath the first and second field effect transistors, wherein the first field effect transistor is aligned over the first region and the second field effect transistor is aligned over the second region.

7. The semiconductor device of claim 6, wherein a threshold voltage of the first field effect transistor is different from a threshold voltage of the second field effect transistor.

8. A semiconductor device comprising:
a first field effect transistor having a source region, a drain region and a channel region;
a second field effect transistor; and
a metal backgate having a first region which lacks a dopant and a second region having a dopant, wherein said metal backgate is located entirely beneath the first and second field effect transistors, and wherein a left side of the first field effect transistor is aligned over the first region and a right side of the first field effect transistor is aligned over the second region.

9. The semiconductor device of claim 8, wherein the first region has a first work function and the second region has a second work function.

10. The semiconductor device of claim 9, further comprising a top gate electrode having a third work function.

* * * * *